(12) United States Patent
Wu et al.

(10) Patent No.: US 12,501,616 B2
(45) Date of Patent: Dec. 16, 2025

(54) MEMORY SYSTEM, SEMICONDUCTOR DEVICE AND FABRICATION METHOD THEREFOR

(71) Applicant: Yangtze Memory Technologies Co., Ltd., Hubei (CN)

(72) Inventors: LinChun Wu, Hubei (CN); CuiCui Kong, Hubei (CN); ZhiLiang Xia, Hubei (CN); ZongLiang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 575 days.

(21) Appl. No.: 17/951,980

(22) Filed: Sep. 23, 2022

(65) Prior Publication Data

US 2024/0107759 A1  Mar. 28, 2024

(51) Int. Cl.
| | |
|---|---|
| H01L 23/00 | (2006.01) |
| H01L 25/065 | (2023.01) |
| H01L 25/18 | (2023.01) |
| H10B 43/27 | (2023.01) |

(52) U.S. Cl.
CPC .............. *H10B 43/27* (2023.02); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ...... H10B 43/27; H01L 24/08; H01L 25/0657
See application file for complete search history.

(56) References Cited

U.S. PATENT DOCUMENTS

| | | | |
|---|---|---|---|
| 2022/0013499 A1* | 1/2022 | Eom | H01L 24/20 |
| 2023/0046782 A1* | 2/2023 | Park | H01L 25/0657 |
| 2023/0071503 A1* | 3/2023 | Du | H10B 41/27 |
| 2023/0140566 A1* | 5/2023 | Park | H10B 41/27 |
| | | | 257/314 |
| 2023/0157016 A1* | 5/2023 | Liao | H10B 41/40 |
| | | | 257/314 |
| 2023/0157027 A1* | 5/2023 | Chen | H10B 43/10 |
| | | | 257/314 |
| 2023/0232621 A1* | 7/2023 | Lin | H10D 30/6713 |
| | | | 257/314 |
| 2023/0301091 A1* | 9/2023 | Jung | H10B 43/10 |
| 2023/0328982 A1* | 10/2023 | Liao | H01L 21/76843 |
| | | | 257/314 |
| 2024/0055413 A1* | 2/2024 | Chang | H01L 24/17 |

* cited by examiner

*Primary Examiner* — Thao P Le
(74) *Attorney, Agent, or Firm* — Oblon, McClelland, Maier & Neustadt, L.L.P.

(57) ABSTRACT

Aspects of the disclosure provide a semiconductor device. The semiconductor device includes a stack of conductive layers and insulating layers stacked alternatingly in a first direction. The stack of conductive layers and insulating layers has a first side and a second side in the first direction. The semiconductor device then includes a semiconductor layer at the first side of the stack of conductive layers and insulating layers, and a first isolation structure extending through, in the first direction, the semiconductor layer and a subset of the stack of conductive layers and insulating layers. The subset of the stack of conductive layers and insulating layers includes a first conductive layer. The first isolation structure separates a first portion of the first conductive layer from a second portion of the first conductive layer.

20 Claims, 15 Drawing Sheets

MEMORY SYSTEM, SEMICONDUCTOR DEVICE AND FABRICATION METHOD THEREFOR

TECHNICAL FIELD

The present application describes embodiments generally related to memory system, semiconductor devices and fabrication processes for the semiconductor devices.

BACKGROUND

Semiconductor manufactures developed vertical device technologies, such as three dimensional (3D) NAND flash memory technology, and the like to achieve higher transistor density without requiring smaller transistors. In some examples, a 3D NAND memory device includes an array of vertical memory cell strings. Each vertical memory cell string includes multiple memory cells that are connected in series. Increasing the number of memory cells in the vertical memory cell string can increase data storage density.

SUMMARY

Aspects of the disclosure provide a semiconductor device that includes a stack of conductive layers and insulating layers stacked alternatingly in a first direction. The stack of conductive layers and insulating layers has a first side and a second side in the first direction. The semiconductor device then includes a semiconductor layer at the first side of the stack of conductive layers and insulating layers, and a first isolation structure extending through, in the first direction, the semiconductor layer and a subset of the stack of conductive layers and insulating layers. The subset of the stack of conductive layers and insulating layers includes a first conductive layer. The first isolation structure separates a first portion of the first conductive layer from a second portion of the first conductive layer.

In some embodiments, the semiconductor device includes a first gate line slit (GLS) structure and a second GLS structure extending through the stack of conductive layers and insulating layers in the first direction. The first GLS structure and the second GLS structure are parallel in a second direction that is perpendicular to the first direction. The first isolation structure is between the first GLS structure and the second GLS structure and is parallel to the first GLS structure and the second GLS structure. In some examples, the semiconductor device further includes a second isolation structure that extends through, in the first direction, the semiconductor layer and the subset of the stack of conductive layers and insulating layers. The second isolation structure and the first isolation structure are between the first GLS structure and the second GLS structure and are parallel to the first GLS structure and the second GLS structure.

In some examples, the subset of the stack of conductive layers and insulating layers comprises the first conductive layer and at least a second conductive layer.

In some embodiments, a first width of the first isolation structure between the first portion of the first conductive layer and the second portion of the first conductive layer is wider than a second width of the first isolation structure between a first portion of the semiconductor layer and a second portion of the semiconductor layer.

In some examples, the semiconductor device includes a first contact structure connected to the first portion of the first conductive layer, and a second contact structure connected to the second portion of the first conductive layer.

In some examples, the semiconductor layer includes polysilicon.

Aspects of the disclosure provide a method for fabricating a semiconductor device. The method includes forming a stack of conductive layers and insulating layers that are stacked alternatingly in a first direction. The stack of conductive layers and insulating layers has a first side and a second side in the first direction. Then, the method includes forming a semiconductor layer at the first side of the stack of conductive layers and insulating layers, and forming a first isolation structure that extends through, in the first direction, the semiconductor layer and a subset of the stack of conductive layers and insulating layers. The subset of the stack of conductive layers and insulating layers includes a first conductive layer. The first isolation structure separates a first portion of the first conductive layer from a second portion of the first conductive layer.

In some examples, the method includes forming a first gate line slit (GLS) structure and a second GLS structure that extend through the stack of conductive layers and insulating layers in the first direction. The first GLS structure and the second GLS structure are parallel in a second direction that is perpendicular to the first direction. The first isolation structure is between the first GLS structure and the second GLS structure and is parallel to the first GLS structure and the second GLS structure.

In some embodiments, the method includes forming a second isolation structure that extends through, in the first direction, the semiconductor layer and the subset of the stack of conductive layers and insulating layers between the first GLS structure and the second GLS structure. The second isolation structure and the first isolation structure are between the first GLS structure and the second GLS structure and are parallel to the first GLS structure and the second GLS structure.

To form the first isolation structure, in some examples, the method includes forming a trench in the semiconductor layer and the subset of the stack of conductive layers and insulating layers and filling the trench with insulating material. To form the trench, the method includes performing a first etching process that creates an opening in the semiconductor layer and the subset of the stack of conductive layers and insulating layers in the first direction, and performing a second etching process that recesses the first conductive layer based on the opening.

In some embodiments, to fill the trench with the insulating material, the method includes depositing the insulating material using atomic layer deposition (ALD).

In some examples, to form the semiconductor layer, the method includes removing an initial stack of layers from the first side of the stack of conductive layers and insulating layers, and depositing the semiconductor layer at the first side of the stack of conductive layers and insulating layers.

Aspects of the disclosure provide a semiconductor memory device that includes a first die and a second die. The first die includes a stack of conductive layers and insulating layers being stacked alternatingly in a first direction. The stack of conductive layers and insulating layers has a first side and a second side in the first direction. The first die also includes a semiconductor layer at the first side of the stack of conductive layers and insulating layers and a first isolation structure extending through, in the first direction, the semiconductor layer and a subset of the stack of conductive layers and insulating layers. The subset of the stack of conductive layers and insulating layers includes a first conductive layer, the first isolation structure separating a first portion of the first conductive layer from a second portion of the first conductive layer. The second die is bonded with the first die and is closer to the second side than to the first side of the stack of conductive layers and insulating layers.

Aspects of the disclosure provide a memory system that includes a memory controller coupled with the semiconductor memory device. The memory control can control data storage operations of the semiconductor memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
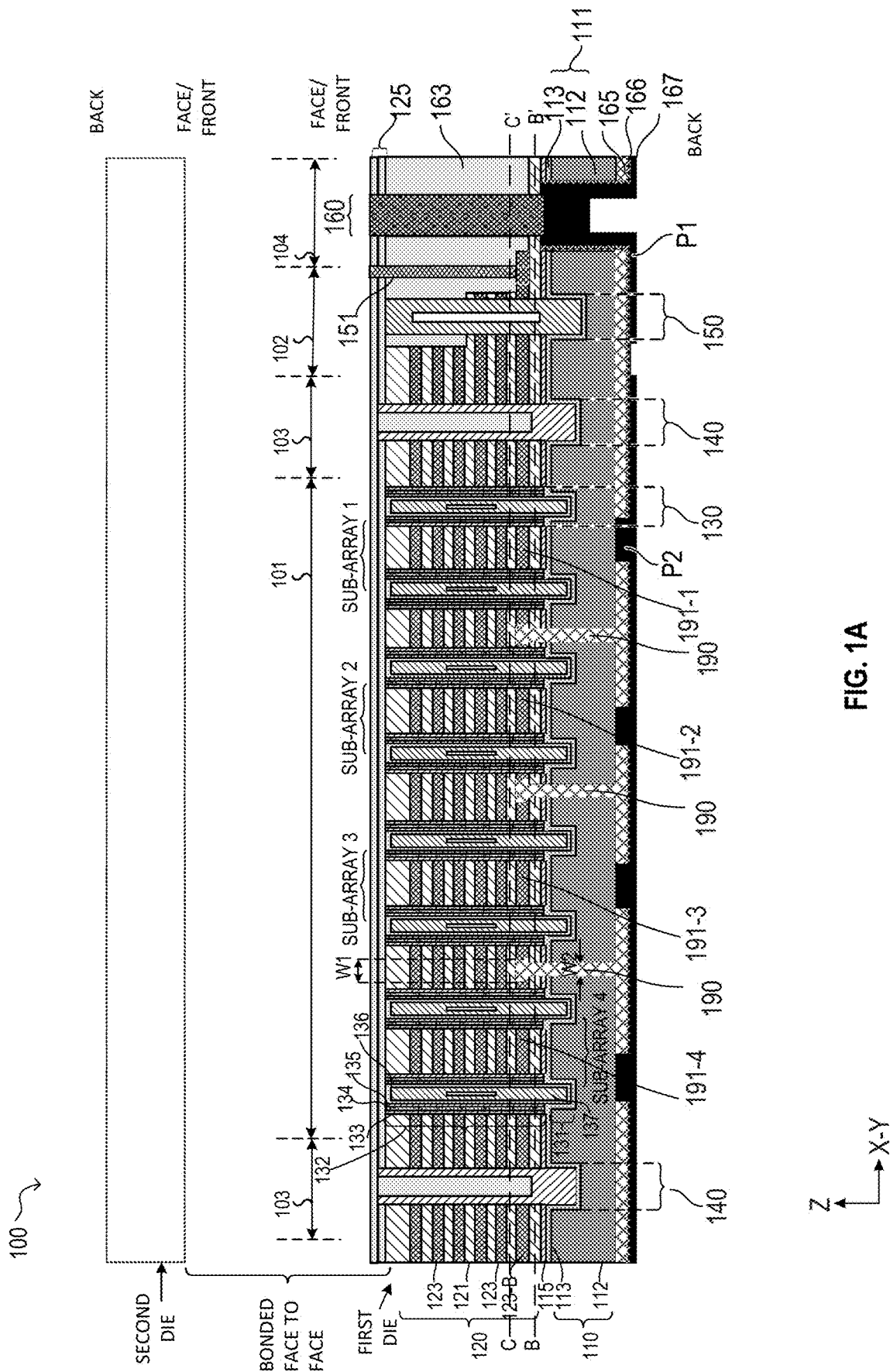
FIGS. 1A-1C show cross-sectional views of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory cell string in a three dimensional (3D) NAND flash memory generally includes memory cell transistors, one or more top select transistors and one or more bottom select transistors. The top select transistor(s) can couple or decouple the memory cells to a bit line based on control signal(s) applied on top select gate(s) (TSG) of the top select transistor(s). The bottom select transistor(s) can couple or decouple the memory cells to an array common source (ACS) terminal for an array of vertical memory cell strings based on control signal(s) applied on bottom select gate(s) (BSG) of the bottom select transistor(s).

In some examples, an array of vertical memory cell strings can be separated into multiple sub-arrays (also referred to as fingers) based on TSG cot structures and BSG cut structures. The sub-arrays can be individually coupled or decoupled to the bit lines and/or the ACS terminal based on control signals respectively for the top select transistors and bottom select transistors of the sub-arrays. The TSG cut structures and the BSG cut structures enable operations (e.g., erase operation, read operation, program operation and the like) at a sub-array level and can improve electronic properties of the memory cells, such as better controlling of threshold voltages of the memory cells.

In some related examples, the BSG cut structures are formed before replacement of sacrificial layers with gate layers in a gate-last process. The replacement of sacrificial layers with gate layers is conducted via trenches for gate line slit structures. When multiple BSG cut structures are formed between two neighboring trenches, the replacement of sacrificial layers with gate layers may fail at portions between the multiple BSG cut structures due to the blocking by the multiple BSG cut structures. Thus, in the related examples, only one BSG cut structure is formed between two neighboring gate line slit structures.

Some semiconductor technologies form structures for semiconductor devices using front side processing and backside processing with regard to a wafer. Aspects of the disclosure provide techniques to use backside processing to form BSG cut structures for an array of vertical memory cells strings formed on the front side of a wafer. The BSG cut structures can be formed after the replacement of sacrificial layers with gate layers in a gate-last process. Thus, one or more BSG cut structures can be formed between two neighboring gate line slit structures. It is noted that the present disclosure is not limited to the gate-last process, and the techniques disclosed in the present disclosure can be used in a gate-first process.

Figure 1B:
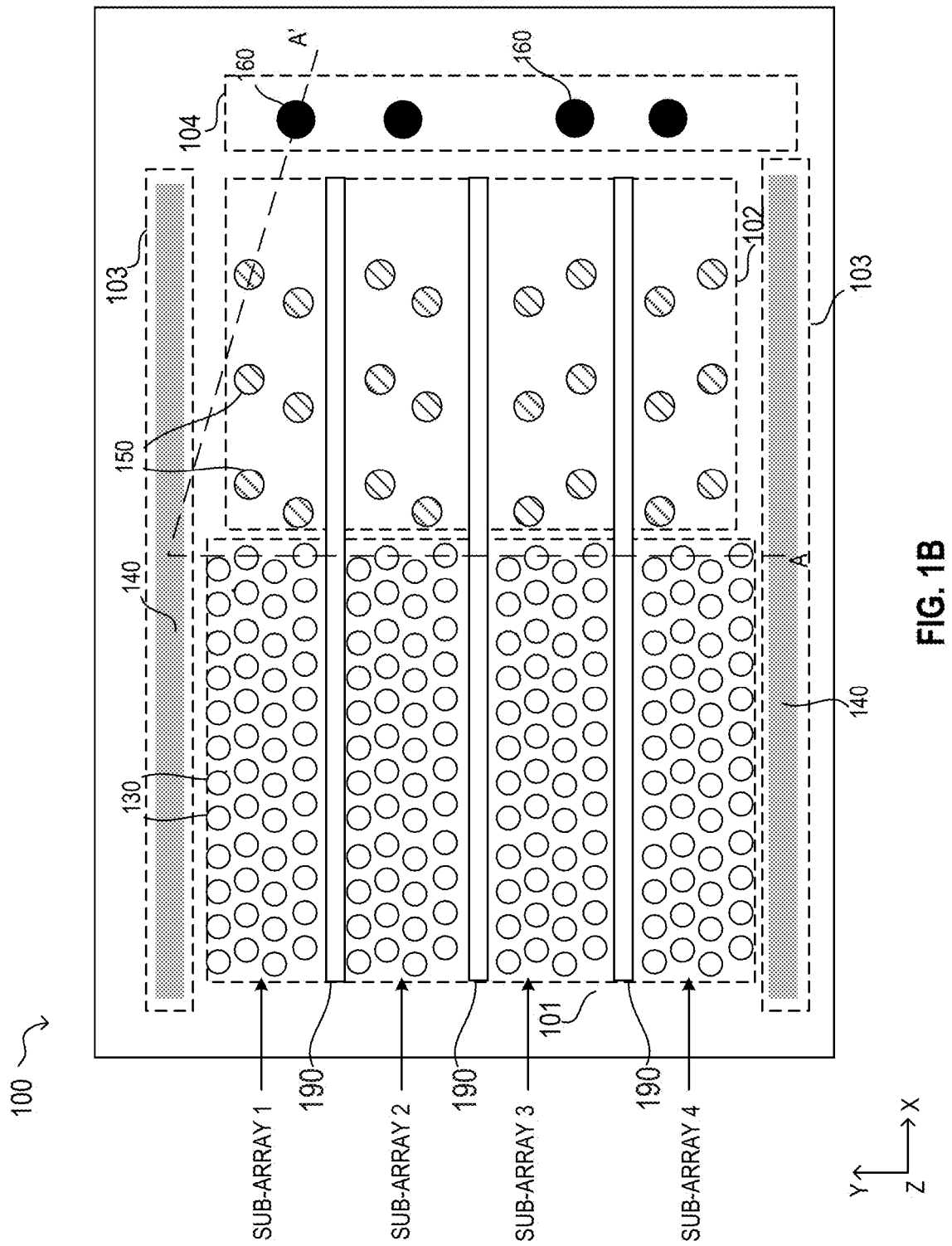
Figure 1C:
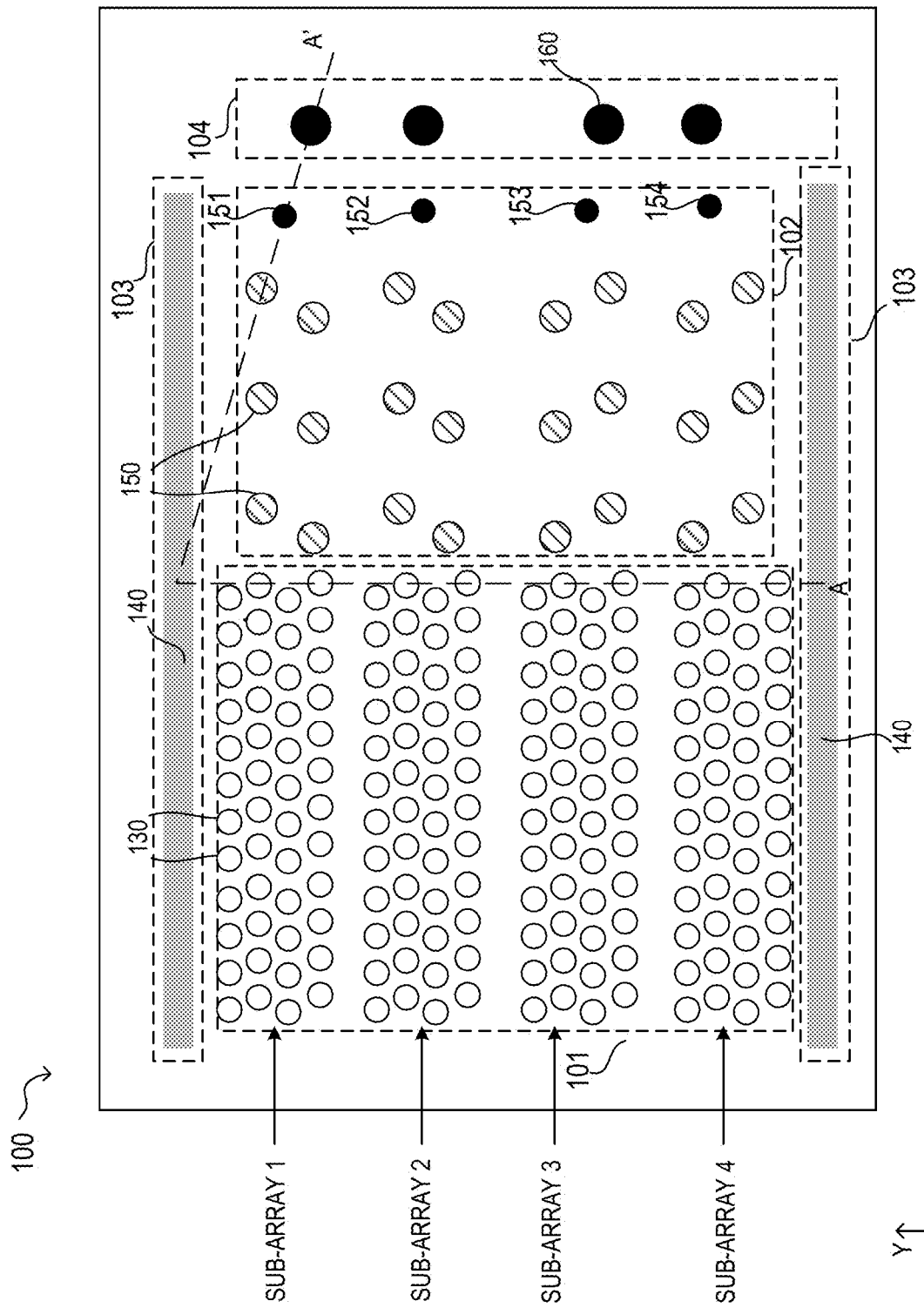

FIGS. 1A-1C show cross-sectional views of a semiconductor device 100 according to some embodiments of the disclosure. FIG. 1A shows the cross-sectional view along A'A line of the semiconductor device 100 shown in FIG. 1B and FIG. 1C FIG. 1B shows the cross-sectional view along B'B line of the semiconductor device 100 shown in FIG. 1A, and FIG. 1C shows the cross-sectional view along C'C line of the semiconductor device 100 shown in FIG. 1A. It is noted that for ease of illustration, features are not drawn to scale, and some components (e.g., TSG cut structures and the like) are omitted for clarity.

As shown in FIGS. 1A-1C, a first die of the semiconductor device 100 includes regions, such as a first region 101, a second region 102, a third region 103 and a fourth region 104, and structures formed in the regions. Specifically, the first region 101 is also referred to as a core region 101, and channel structures 130 formed in the core region 101; the second region 102 is also referred to as a staircase region 102, and dummy channel structures 150 formed in the staircase region 102; the third region 103 is also referred to as a gate line slit region 103, and gate line slit structures 140 formed in the gate line slit region 103; the fourth region 104 is also referred to as a peripheral contact region 104 in some examples, and peripheral contact structures 160 formed in the peripheral contact region 104.

According to some aspects of the disclosure, the first die of the semiconductor device 100 includes one or more BSG cut structures 190 between neighboring gate line slit structures 140. The one or more BSG cut structures 190 can separate an array of channel structures 130 between two neighboring gate line slit structures 140 into sub-arrays that are also referred to as fingers in some examples. In the example shown in FIGS. 1A-1C, the first die of the semiconductor device 100 includes 3 BSG cut structures 190 between neighboring gate line slit structures 140, and the three BSG cut structures 190 separate the array of channel structures 130 between the neighboring gate line slit structures 140 into 4 sub-arrays shown by SUB-ARRAY 1, SUB-ARRAY 2, SUB-ARRAY 3 and SUB-ARRAY 4.

Specifically, the BSG cut structures 190 are formed of insulating material(s), and the BSG cut structures 190 can cut through one or more gate layers for bottom select transistors into separate sub portions, such as shown by sub portions 191-1, 191-2, 191-3 and 191-4. The sub portions are isolated from each other by the BSG cut structures 190. Further, separate contact structures (not shown) can be formed in the staircase region 102 to respectively connect the sub portions 191-1, 191-2, 191-3 and 191-4 with driving circuitry to provide respective control signals to the sub portions 191-1, 191-2, 191-3 and 191-4. Thus, the control signals can then control the coupling/decoupling of the respective sub-arrays SUB-ARRAY 1, SUB-ARRAY 2, SUB-ARRAY 3 and SUB-ARRAY 4 to an array common source (ACS) terminal.

It is noted that each of the BSG cut structures 190 can extend in the core region 101 and the staircase region 102 to separate the one or more gate layers into separate sub portions.

It is also noted that, in some examples, TSG cut structures (not shown) can be formed and may be aligned with the BSG cut structures 190 in the Z direction.

It is noted that, as shown in FIG. 1A, the semiconductor device 100 can include additional die(s), such as a second die. In some examples, the semiconductor device 100 includes the first die and the second die that are bonded face to face (e.g., front side to front side). For example, the first die includes a memory cell array formed on the front side and can be referred to as an array die; and the second die includes periphery circuitry formed on the front side and can be referred to as periphery die. In some examples, the periphery circuitry is formed using complementary metal-oxide-semiconductor (CMOS) technology, and the periphery die is also referred to as CMOS die.

It is noted that, in some other embodiments, a semiconductor device can include a plurality of array dies and a CMOS die. The plurality of array dies and the CMOS die can be stacked and bonded together. The CMOS die is respectively coupled to the plurality of array dies, and can drive the respective array dies.

The semiconductor device 100 can be device at any suitable scale, such as wafer scale, chip scale, package scale and the like. In some examples (e.g., wafer scale), the semiconductor device 100 includes at least a first wafer and a second wafer bonded face to face. The array die is disposed with other array dies on the first wafer, and the CMOS die is disposed with other CMOS dies on the second wafer. The first wafer and the second wafer are bonded together, thus the array dies on the first wafer are bonded with corresponding CMOS dies on the second wafer. In some examples (e.g., chip scale), the semiconductor device 100 is a chip with at least the array die and the CMOS die bonded together. In an example, the chip is diced from wafers that are bonded together. In another example (e.g., package scale), the semiconductor device 100 is a semiconductor package that includes one or more semiconductor chips assembled on a package substrate.

FIG. 1A shows a plurality of channel structures in the core region 101, two gate line slit structures 140 in the gate line slit regions 103, a dummy channel structure 150 in the staircase region 102 and a peripheral contact structure 160 in a peripheral contact region 104.

A channel structure 130 includes a body portion 132 formed in a second stack 120 of layers, and an end portion 131 in a first stack 110 of layers. The first stack 110 of layers includes a semiconductor layer 111. In an example, the semiconductor layer 111 is formed by replacing a stop layer (not shown) using backside processing. The second stack 120 of layers includes gate layers 123 and insulating layers 121 alternatingly stacked on a front side of the array die. The front side is opposite to the backside.

In some embodiments, the channel structure 130 has a pillar shape that extends in the Z direction that is perpendicular to the direction of the main surface X-Y plane. In an embodiment, the channel structure 130 is formed by materials in the circular shape (or elliptical shape or polygonal shape) in the X-Y plane, and extends in the Z direction. For example, the channel structure 130 includes function layers, such as a blocking insulating layer 133 (e.g., silicon oxide), a charge storage layer 134 (e.g., silicon nitride), a tunneling insulating layer 135 (e.g., silicon oxide), a semiconductor layer 136, and an insulating layer 137 that have the circular shape (or elliptical shape or polygonal shape) in the X-Y plane, and extend in the Z direction. In an example, the blocking insulating layer 133 (e.g., silicon oxide) is formed on the sidewall of a channel hole for the channel structure 130, and then the charge storage layer 134 (e.g., silicon nitride), the tunneling insulating layer 135, the semiconductor layer 136, and the insulating layer 137 are sequentially stacked from the sidewall. The semiconductor layer 136 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ $cm^3$ in some examples. The insulating layer 137 is formed of an insulating material, such as silicon oxide and/or silicon nitride, and/or may be formed as an air gap.

According to some aspects of the disclosure, the channel structure 130 and the second stack 120 of layers together form a vertical memory cell string. For example, the semiconductor layer 136 corresponds to the channel portions for transistors in the memory cell string, and the gate layers 123 corresponds to the gates of the transistors in the vertical memory cells string. Generally, a transistor has a gate that controls a channel, and has a drain and a source at each side of the channel. For simplicity, in the FIG. 1A example, the upper side of the channel for transistors in FIG. 1A is referred to as the drain, and the bottom side of the channel for transistors in FIG. 1A is referred to as the source. It is noted that the drain and the source can be switched under certain driving configurations. In the FIG. 1A example, the semiconductor layer 136 corresponds to connected channels of the transistors. For a specific transistor, the drain of the specific transistor is connected with a source of an upper transistor above the specific transistor, and the source of the specific transistor is connected with a drain of a lower transistor below the specific transistor. Thus, the transistors in the vertical memory cell string are connected in series.

In the FIG. 1A example, the end portion 131 includes a portion of the semiconductor layer 136, and a portion of the insulating layer 137. In some examples, the blocking insulating layer 133, the charge storage layer 134, and the tunneling insulating layer 135 at the end portion 131 are removed by backside processing. In some examples, an initial end portion corresponding to the end portion 131 also includes the blocking insulating layer 133, the charge storage layer 134, and the tunneling insulating layer 135. The initial end portion is formed in an initial first stack of layer having a stop layer (not shown) in the core region 101. The stop layer can be removed by backside processing. The blocking insulating layer 133, the charge storage layer 134, and the tunneling insulating layer 135 at the initial end portion can be removed by the backside processing. Further, the semiconductor layer 111 can be formed by the backside processing.

According to some aspects of the disclosure, the semiconductor layer 136 at the end portion 131 corresponds to a source terminal of the vertical memory cell string, and the semiconductor layer 111 in the first stack 110 is configured to connect the source terminals of an array of the vertical memory cell strings to an array common source (ACS) terminal, such as shown by P2. In the FIG. 1A example, the semiconductor layer 111 includes a first semiconductor layer 113 and a second semiconductor layer 112. In an example, the second semiconductor layer 112 is a bulk portion 112 of the semiconductor layer 111, and the first semiconductor layer 113 is a liner portion 113 (e.g. a conformal portion) of the semiconductor layer 111. The liner portion 113 is in contact with the semiconductor layer 136. In an example, the liner portion 113 can be doped by ion implantation to achieve a desired doping profile. In another example, the semiconductor layer 111 only includes the bulk portion 112 which is in contact with the semiconductor layer 136. In some examples, the semiconductor layer 111 is silicon material, such as doped polysilicon (such as N-type doped silicon, P-type doped silicon) and the like.

In the FIGS. 1A-1C example, each of the gate line slit (GLS) structures 140 is formed in the second stack 120 of layers with an end portion in the first stack 110 of layers. The GLS structures 140 can be used to facilitate replacement of sacrificial layers with the gate layers 123 in a gate-last process. In some examples, the GLS structures 140 are formed by filling a trench with one or more dielectric materials. It is noted that the quantity and arrangement of the channel structures 130 between the GLS structures 140 can vary.

The end portion of the GLS structures 140 is in the first stack 110 of layers. In some examples, the end portion of the GLS structure 140 is formed in an initial first stack of layer having a stop layer (not shown) in the gate line slit region 103. The stop layer can be removed by backside processing. Further, the semiconductor layer 111 can be formed by backside processing.

It is noted that in some examples (not shown), a GLS structure 140 may include a conductive material (not shown) and can be configured to function as an ACS terminal.

In the FIG. 1A example, the gate layers 123 and the insulating layers 121 are arranged in a form of stair steps in the staircase region 102. For example, each stair step can include one or more pairs of the insulating layer 121 and the gate layer 123. The staircase region 102 is also filled with insulating material 163 and is planarized with other regions. Gate contact structures (e.g., a gate contact structure 151 shown in FIG. 1A, the gate structure 151, and gate structures 152-154 shown in FIG. 1C) can be disposed on the stair steps and be connected to the respective gate layers 123. The gate contact structures are used to connect driving circuitry to the respective gate layers 123 to control the stacked memory cells and select gates.

In the FIGS. 1A-1C example, the dummy channel structures 150 are formed in staircase region 102 with an end portion in the first stack 110. The dummy channel structures 150 can prevent the second stack 120 of layers from collapsing during a replacement of sacrificial layers with the gate layers 123 in a gate-last process. The dummy channel structures 150 can include one or more dielectric materials. In an example, dummy channel structures 150 can be disposed in the staircase region 102 between the GLS structures 140. In another example, one or more dummy channel structures 150 can also be disposed in the core region 101.

The end portion of the dummy channel structure 150 is in the first stack 110 of layers. In some examples, the end portion of the dummy channel structure 150 is formed in an initial first stack of layers having a stop layer (not shown) in the staircase region 102. The stop layer can be removed by backside processing. Further, the semiconductor layer 111 can be formed by backside processing.

In the FIGS. 1A-1C example, the peripheral contact structure 160 is formed in the peripheral contact region 104. In the FIG. 1A example, the peripheral contact region 104 is filled with the insulating material 163 and is planarized with other regions. The peripheral contact structure 160 can extend from the front side of the array die to the backside of the array die, and conductively interconnect conductive structures on the front side of the array die with conductive structures on the backside of the array die. In an example, the peripheral contact structure 160 can conductively interconnect a bonding structure on the front side of the array die with a pad structure on the backside of the array die. The bonding structure on the front side of the array die can be bonded with a bonding structure on the CMOS die.

In an example, the peripheral contact structure 160 extends through a capping layer 125 and the insulating layer 163, and is in contact with a conductive layer 167. It is noted that the present disclosure does not limit the position of the end of the peripheral contact structure 160, the end of the peripheral contact structure 160 can be positioned at the same level as the top etch stop layer 115 or can extend through the top etch stop layer 115. In some examples, the conductive layer 167 is patterned into pad structures. The end of the peripheral contact structure 160 is in contact with a portion of the conductive layer 167 corresponding to a pad structure P1. The conductive layer 167 can include one or more metal materials, such as aluminum (Al), titanium (Ti), and the like. The conductive layer 167 can be separated from the semiconductor layer 111 by an insulating layer 165 (e.g., silicon oxide) and a spacer layer 166 (e.g., silicon oxide).

According to some aspects of the disclosure, the BSG cut structures 190 are formed of insulating material(s) by backside processing. The BSG cut structures 190 extend through the first stack 110 of layers, and into the second stack 120 of layers, and separate the one or more gate layers 123 for the bottom select transistors into sub portions. For example, when the vertical memory cell string includes one bottom select transistor, the BSG cut structures 190 extends into the second stack 120 of layers and cut (separate) a gate layer 123-B for the bottom select transistors into sub portions, such as sub portions 191-1, 191-2, 191-3 and 191-4. In another example, when the vertical memory cell string includes two bottom select transistors, the BSG cut structures 190 extends into the second stack 120 of layers and cut two gate layers 123 (e.g., the gate layer 123-B and another gate layer 123 above the gate layer 123-B in Z direction in FIG. 1A) for the bottom select transistors into sub portions. In some examples, the BSG cut structures 190 are formed based on the insulating layer 165, and thus have the same material as the insulating layer 165. It is noted that the BSG cut structures 190 can be formed of different material from the insulating layer 165.

In some examples, the BSG cut structures 190 are formed by generating trenches into the first stack 110 and a subset of the second stack 120 and filling the insulating material into the trenches. In an example, after the trenches are generated, an etching process that can recess the gate layer(s), such as the gate layer 123(B), in Y direction is performed to enlarge the trench opening in the gate layer(s) in order to avoid residue induced short circuits. Accordingly, the BSG cut structures 190 can have a relatively large width between portions of the gate layer(s). In the FIG. 1A example, the BSG cut structures 190 can have a first width W1 between portions of the gate layer 123(B), and have a second width W2 between portions of the semiconductor layer 111. The first width W1 is wider than the second width W2 in some examples.

According to an aspect of the disclosure, the gates of the bottom select transistors for the respective sub-arrays SUB-ARRAY 1, SUB-ARRAY 2, SUB-ARRAY 3 and SUB-ARRAY 4 can be controlled by individual control signals in some examples. For example, the semiconductor device 100 includes a first gate contact structure 151 in the staircase region 102 that is conductively connected to the sub portion 191-1; a second gate contact structure 152 in the staircase region 102 that is conductively connected to the sub portion 191-2; a third gate contact structure 153 in the staircase region 102 that is conductively connected to the sub portion 191-3; a fourth gate contact structure 154 in the staircase region 102 that is conductively connected to the sub portion 191-4. The first gate contact structure 151, the second gate contact structure 152, the third gate contact structure 153 and the fourth gate contact structure 154 can be connected to different driving circuitry. Accordingly, in some examples, the sub-arrays SUB-ARRAY 1, SUB-ARRAY 2, SUB-ARRAY 3 and SUB-ARRAY 4 can be controlled individually for various operations, such as erase operations, read operations, program operations. In an example, the sub-array SUB-ARRAY 1 is erased slower than the sub-arrays SUB-ARRAY 2, SUB-ARRAY 3 and SUB-ARRAY 4. In an example, initially, erase operations are performed in erase cycles at the sub-arrays SUB-ARRAY 1, SUB-ARRAY 2, SUB-ARRAY 3 and SUB-ARRAY 4. After the sub-arrays SUB-ARRAY 2, SUB-ARRAY 3 and SUB-ARRAY 4 are erased with success, the erase operations can be performed in erase cycles at the sub-array SUB-ARRAY 1 without being performed at the sub-arrays SUB-ARRAY 2, SUB-ARRAY 3 and SUB-ARRAY 4. Thus, over-erase can be avoided for the sub-arrays SUB-ARRAY 2, SUB-ARRAY 3 and SUB-ARRAY 4 in an example.

Figure 2:
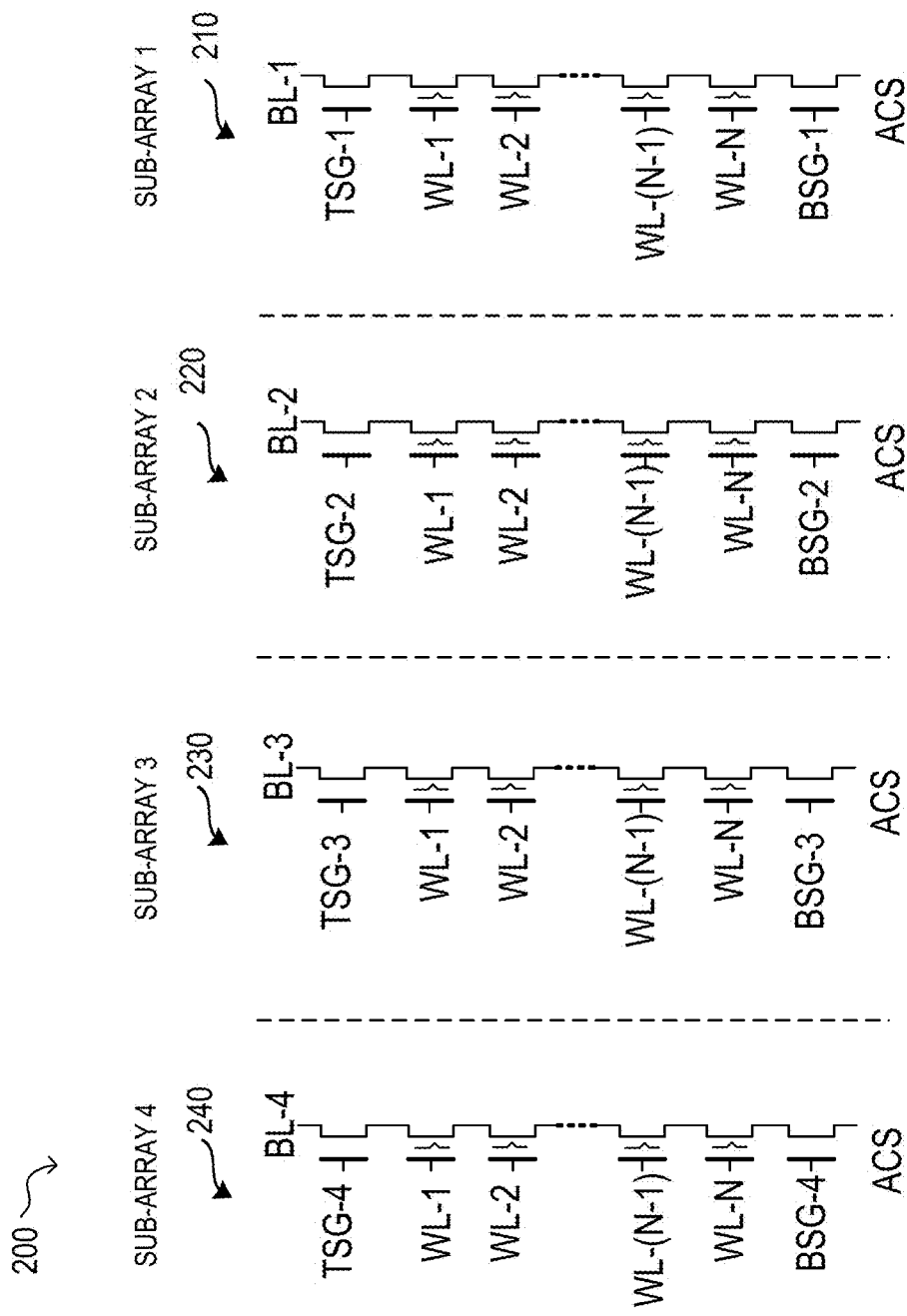
FIG. 2 shows a schematic diagram corresponding to the semiconductor device in some examples.

FIG. 2 shows a schematic diagram 200 corresponding to the semiconductor device 100 in some examples. The schematic diagram 200 shows a vertical memory cell string 210 representing vertical memory cell strings in the SUB-ARRAY 1; a vertical memory cell string 220 representing vertical memory cell strings in the SUB-ARRAY 2; a vertical memory cell string 230 representing vertical memory cell strings in the SUB-ARRAY 3; and a vertical memory cell string 240 representing vertical memory cell strings in the SUB-ARRAY 4. The vertical memory cell strings in the SUB-ARRAY 1, SUB-ARRAY 2, SUB-ARRAY 3 and SUB-ARRAY 4 can share an array common source (ACS) terminal.

In FIG. 2, each of the vertical memory cell strings 210, 220, 230 and 240 includes a top select transistor, N memory cell transistors (N is a positive integer), and a bottom select transistor. The gate layers for the N memory cell transistors are connected in the regions of the SUB-ARRAY 1, the SUB-ARRAY 2, the SUB-ARRAY 3 and the SUB-ARRAY 4, the vertical memory cell strings 210, 220, 230 and 240 share the word line control signals. For example, the gate of the top most memory cell transistor of the vertical memory cell string 210, the gate of the top most memory cell transistor of the vertical memory cell string 220, the gate of the top most memory cell transistor of the vertical memory cell string 230, the gate of the top most memory cell transistor of the vertical memory cell string 240 are connected in the same gate layer, and can be controlled by a same word line control signal WL-1. Similarly, the gate of the bottom most memory cell transistor of the vertical memory cell string 210, the gate of the bottom most memory cell transistor of the vertical memory cell string 220, the gate of the bottom most memory cell transistor of the vertical memory cell string 230, the gate of the bottom most memory cell transistor of the vertical memory cell string 240 are connected in the same gate layer, and can be controlled by a same word line control signal WL-N.

However, the gate layer for the bottom select transistors in the SUB-ARRAY 1, the SUB-ARRAY 2, the SUB-ARRAY 3 and the SUB-ARRAY 4 is separated by the BSG cut structures 190 into sub portions, such as the sub portions 191-1, 191-2, 191-3, and 191-4. The vertical memory cell strings 210, 220, 230 and 240 can have individual bottom select gate control signals. For example, the gate of the bottom select transistor of the vertical memory cell string 210 is controlled by a bottom select gate control signal BSG-1; the gate of the bottom select transistor of the vertical memory cell string 220 is controlled by a bottom select gate control signal BSG-2; the gate of the bottom select transistor of the vertical memory cell string 230 is controlled by a bottom select gate control signal BSG-3; the gate of the bottom select transistor of the vertical memory cell string 240 is controlled by a bottom select gate control signal BSG-4.

Similarly, in some examples, the gate layer for the top select transistors in the SUB-ARRAY 1, the SUB-ARRAY 2, the SUB-ARRAY 3 and the SUB-ARRAY 4 is separated by the TSG cut structures, the vertical memory cell strings 210, 220, 230 and 240 can have individual top select gate control signals. For example, the gate of the top select transistor of the vertical memory cell string 210 is controlled by a top select gate control signal TSG-1; the gate of the top select transistor of the vertical memory cell string 220 is controlled by a top select gate control signal TSG-2; the gate of the top select transistor of the vertical memory cell string 230 is controlled by a top select gate control signal TSG-3; the gate of the top select transistor of the vertical memory cell string 240 is controlled by a top select gate control signal TSG-4.

While the example in FIG. 2 uses one top select transistor and one bottom select transistor in the vertical memory cell strings, it is understood that the vertical memory cell strings can have more than one top select transistors and/or more than one bottom select transistors in each string.

Figure 3:
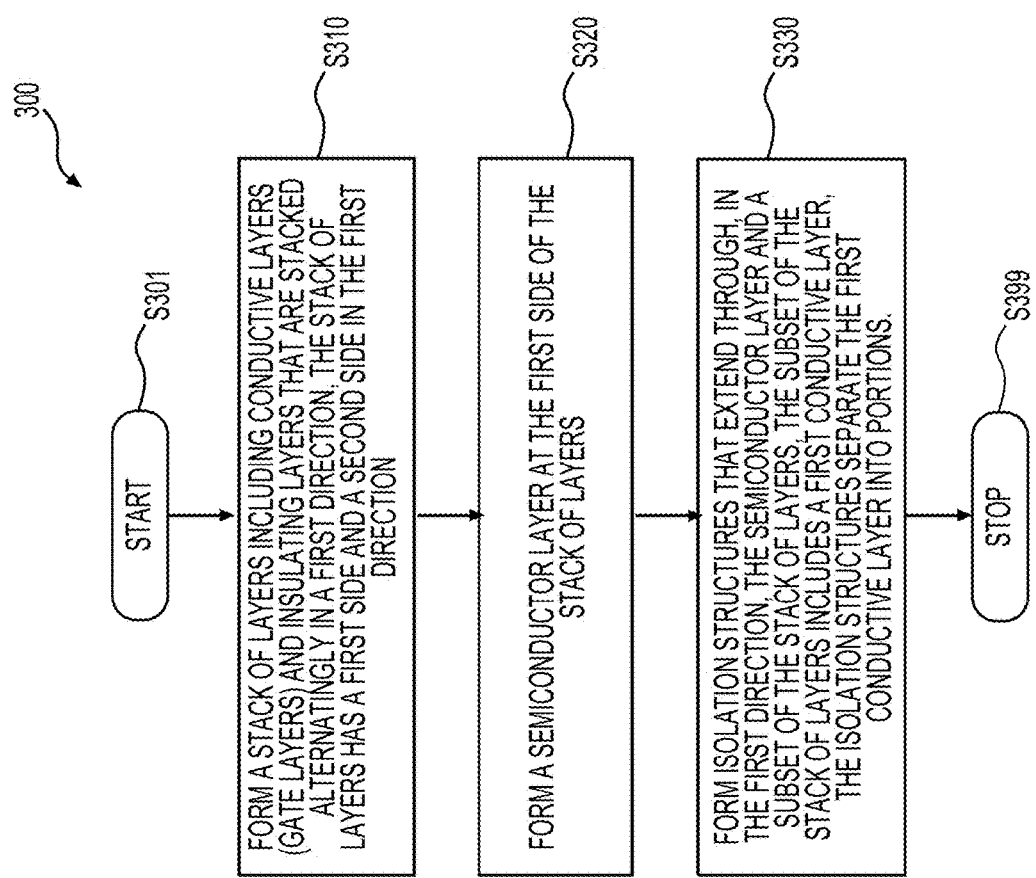
FIG. 3 shows a flow chart outlining a process in some examples.

FIG. 3 shows a flow chart outlining a process 300 in some examples. The process 300 can be used to form a semiconductor device, such as the semiconductor device 100, and the like. The process starts at S301 and proceeds to S310.

At S310, a stack of layers (e.g., the second stack 120) is formed on a first die, such as an array die. The stack of layers includes conductive layers (e.g., the gate layers 123) and insulating layers (e.g., the insulating layer 121) that are stacked alternatingly in a first direction, such as Z direction in FIG. 1A. The stack of layers has a first side (e.g., back side) and a second side (e.g., front side) in the first direction.

At S320, a semiconductor layer (e.g., the semiconductor layer 111) is formed at the first side of the stack of layers.

At S330, one or more isolation structures are formed. The one or more isolation structures (e.g., the BSG cut structures 190) can extend through, in the first direction, the semiconductor layer and a subset of the stack of layers. The subset of the stack of layers includes at least a first conductive layer, such as the gate layer 123-B. The one or more isolation structures separate the first conductive layer into portions.

In some examples, GLS structures are formed and can extend through the stack of layers in the first direction. The GLS structures are parallel in a second direction (e.g., X direction) that is perpendicular to the first direction (e.g., Z direction). The one or more isolation structures are between two neighboring GLS structures and are parallel to the GLS structures.

In some examples, to form the isolation structures, trenches are formed in the semiconductor layer and the subset of the stack of conductive layers and insulating layers. Then, insulating material is filled into the trenches.

In some examples, to form a trench into the semiconductor layer and the subset of the stack of conductive layers and insulating layers, a first etching process is performed, and the first etching process can create an opening in the semiconductor layer and the subset of the stack of conductive layers and insulating layers in the first direction. Then, a second etching process is performed, and the second etching process can recess the first conductive layer (e.g., in the Y direction) based on the opening.

In some examples, to fill the trench with the insulating material, atomic layer deposition (ALD) can be used to deposit the insulating material.

In some examples, to form the semiconductor layer, an initial stack of layers can be removed from the first side of the stack of conductive layers and insulating layers, and then the semiconductor layer can be deposited at the first side of the stack of conductive layers and insulating layers.

Figure 4A:
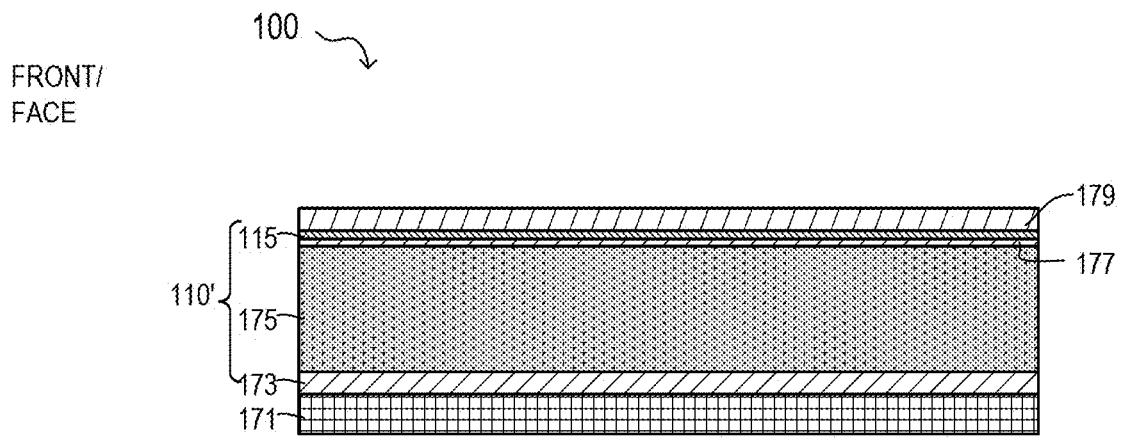
FIGS. 4A-4R show cross-sectional views of a semiconductor device, at various intermediate steps of wafer level manufacturing, in accordance with some embodiments.
Figure 4B:
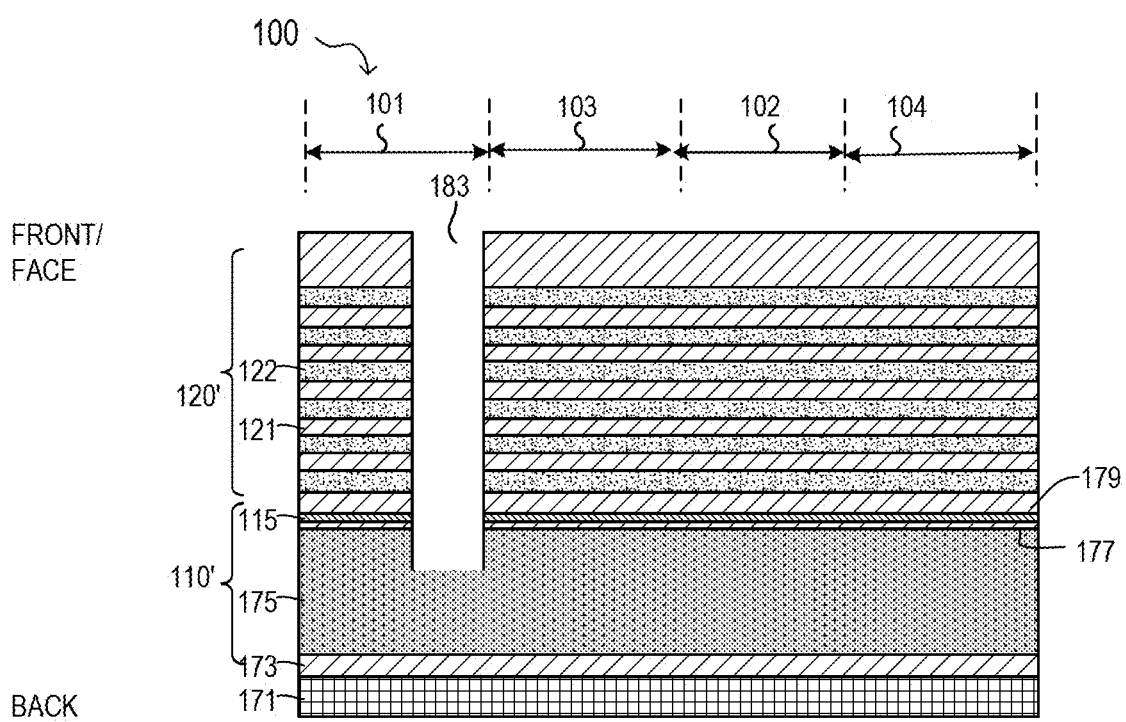
Figure 4C:
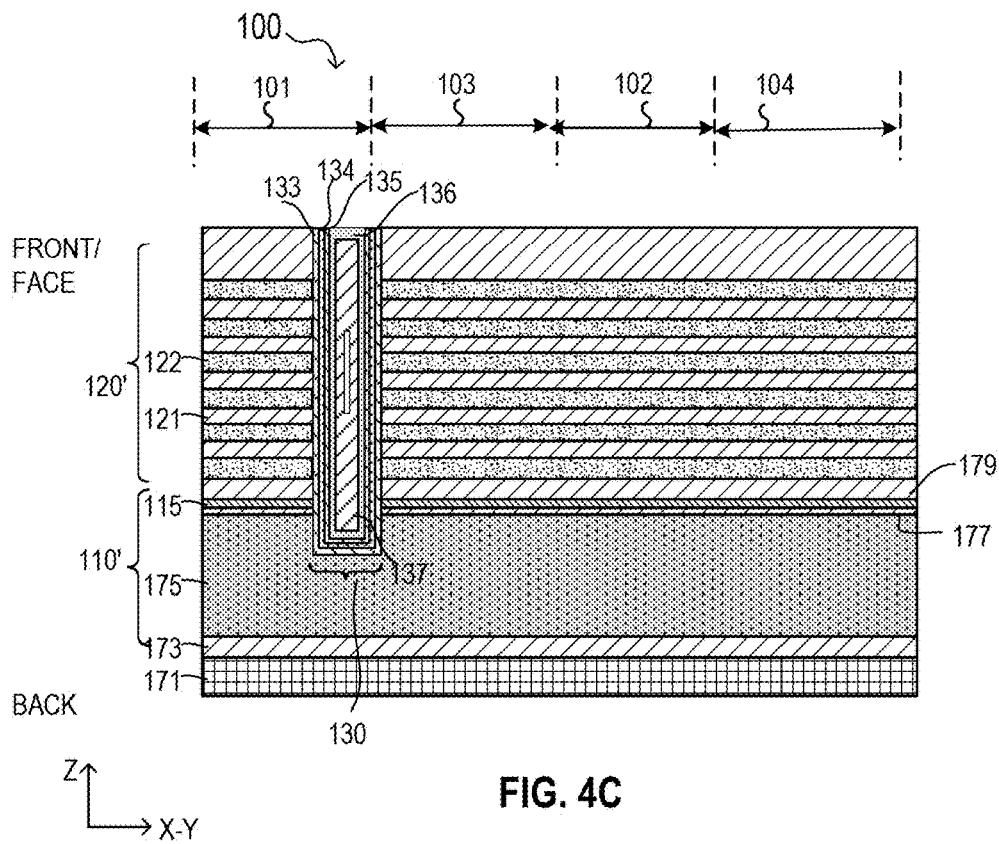
Figure 4D:
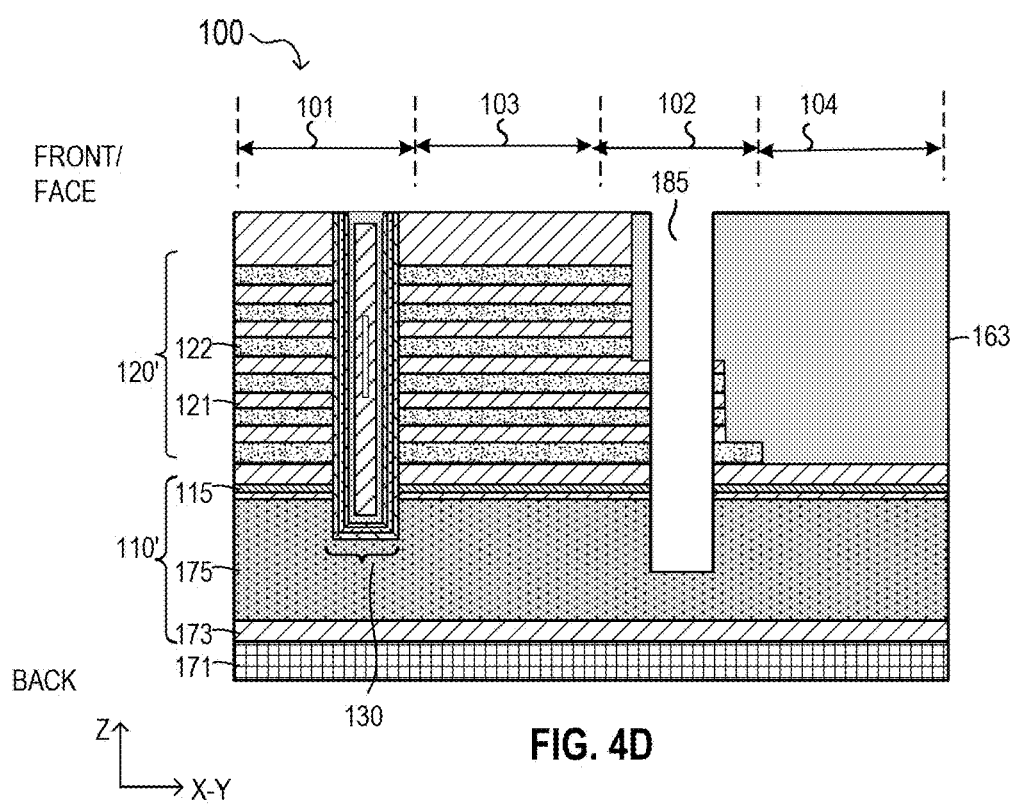
Figure 4E:
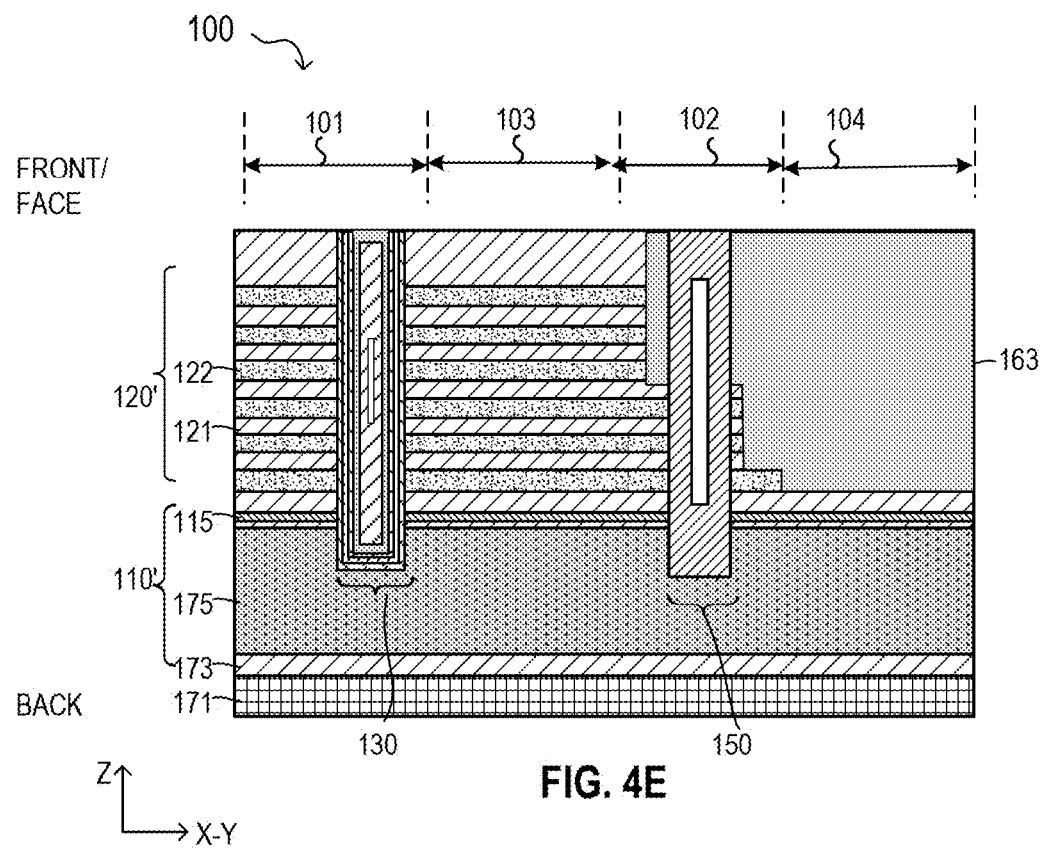
Figure 4F:
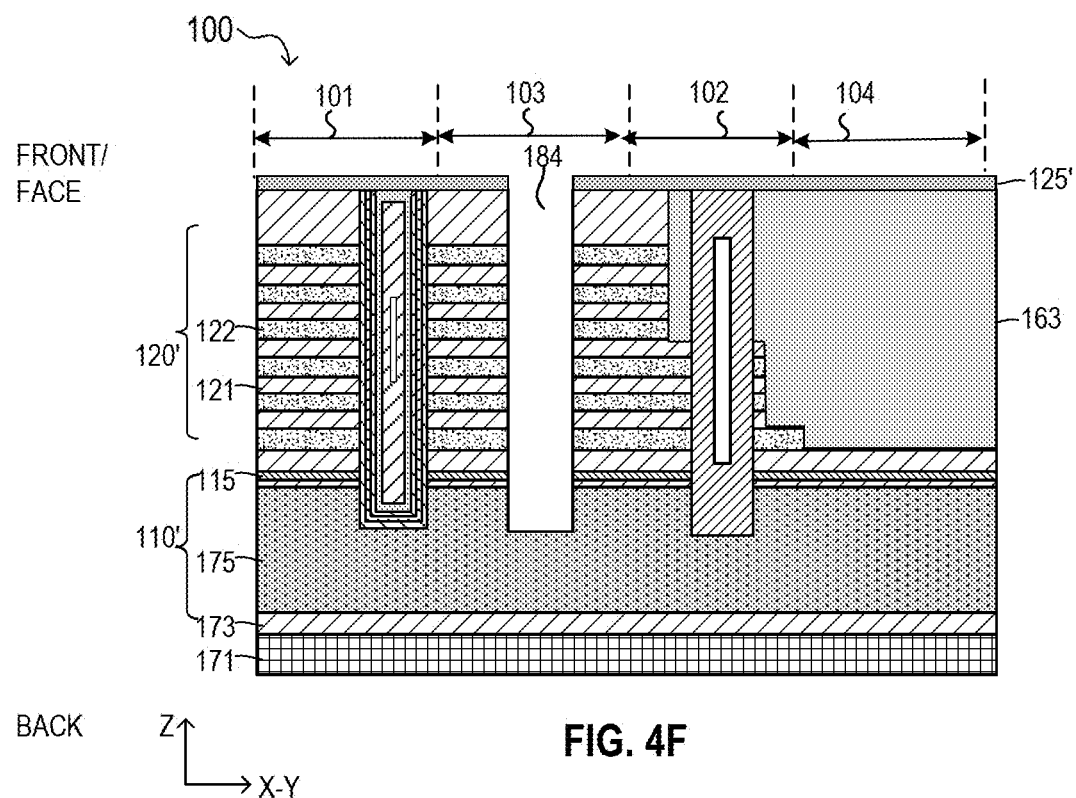
Figure 4G:
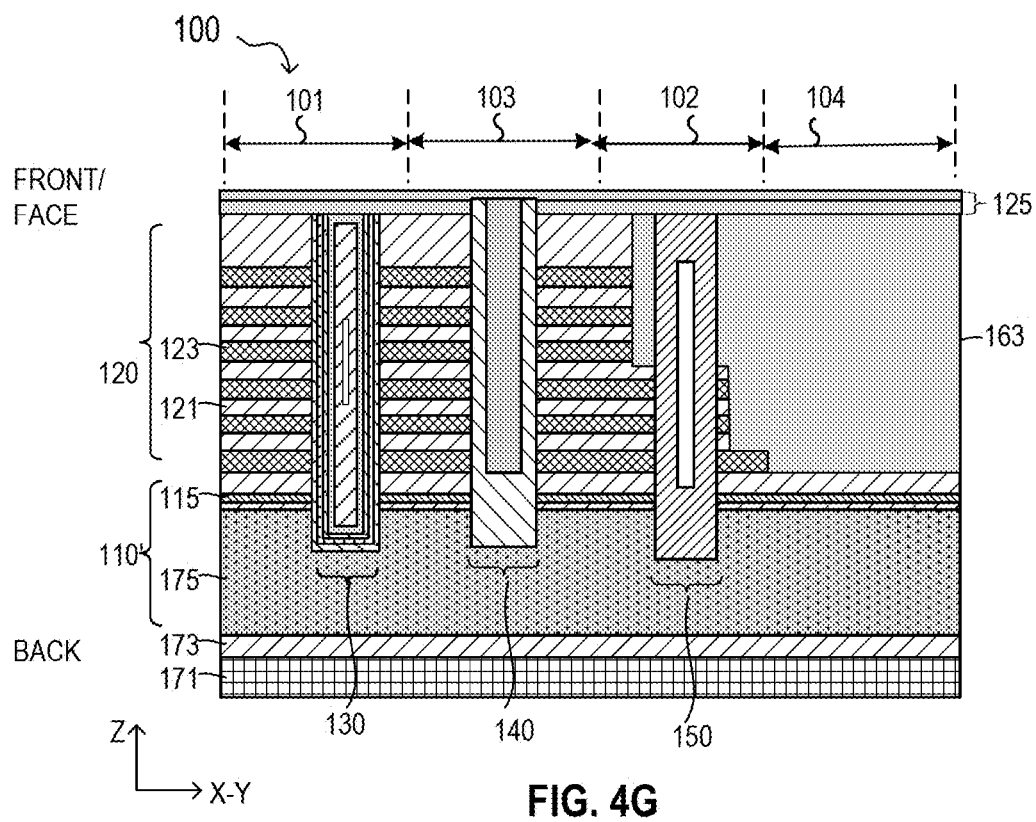
Figure 4H:
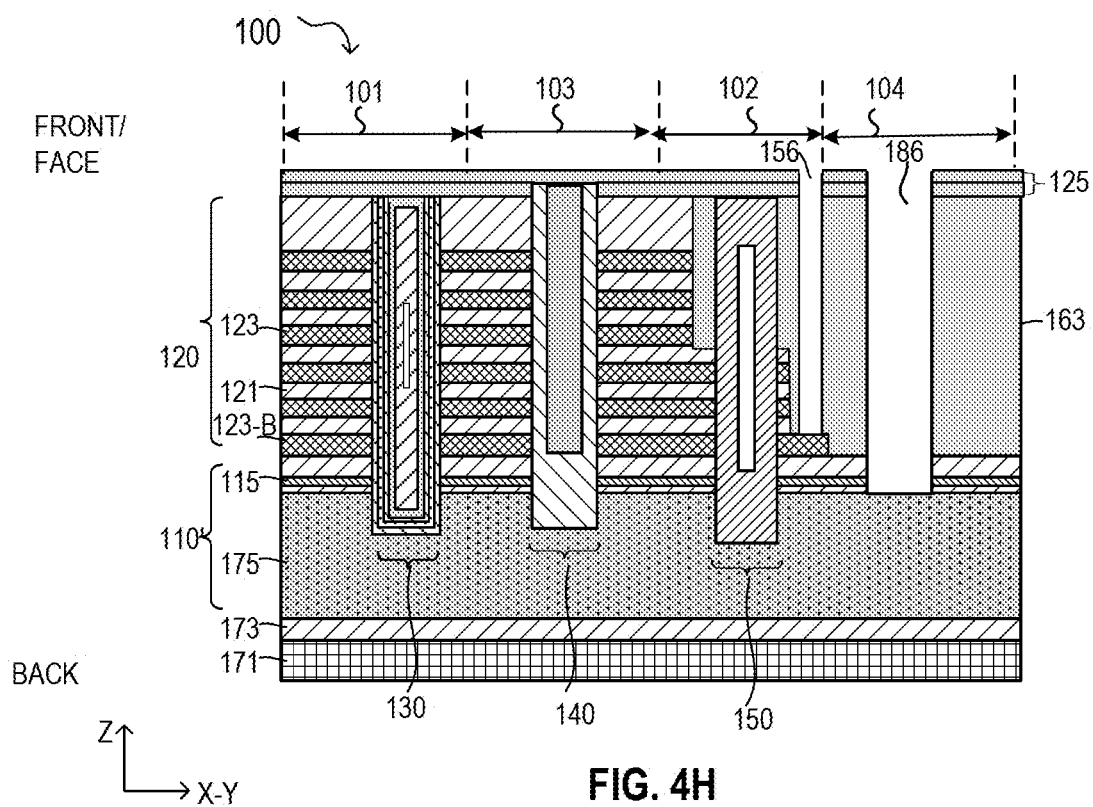
Figure 4I:
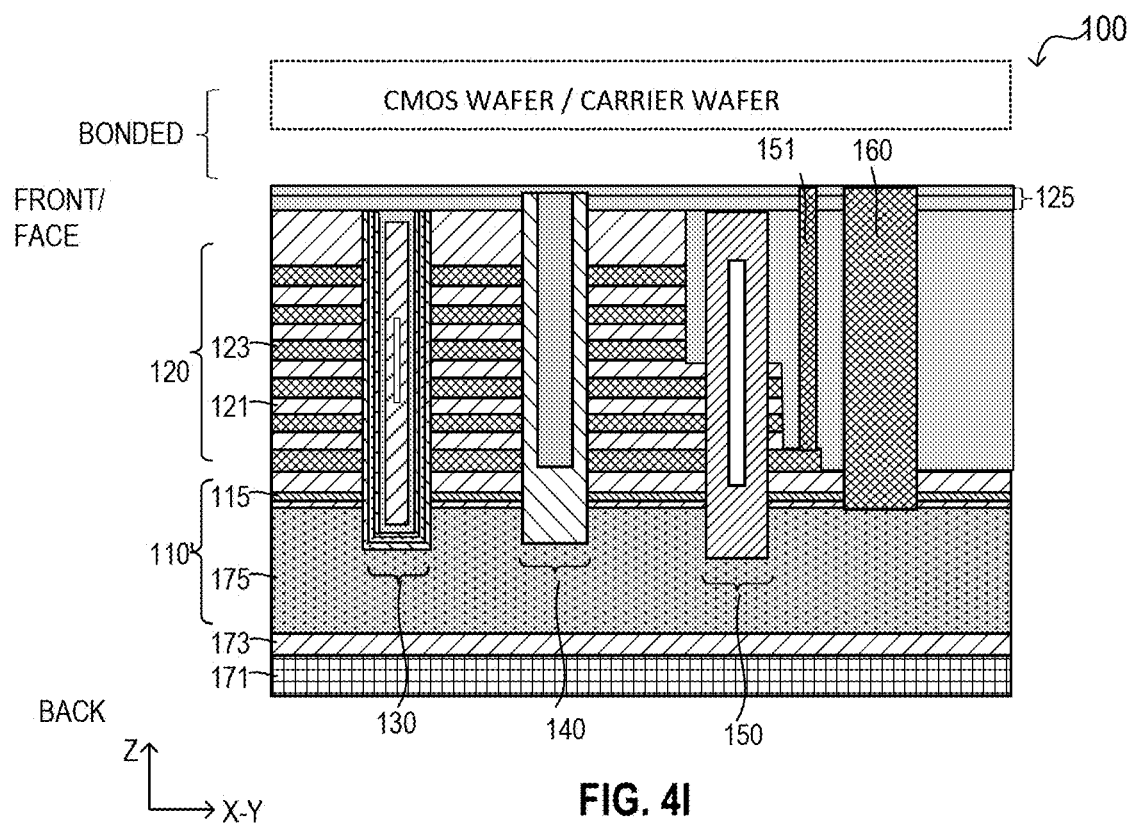
Figure 4J:
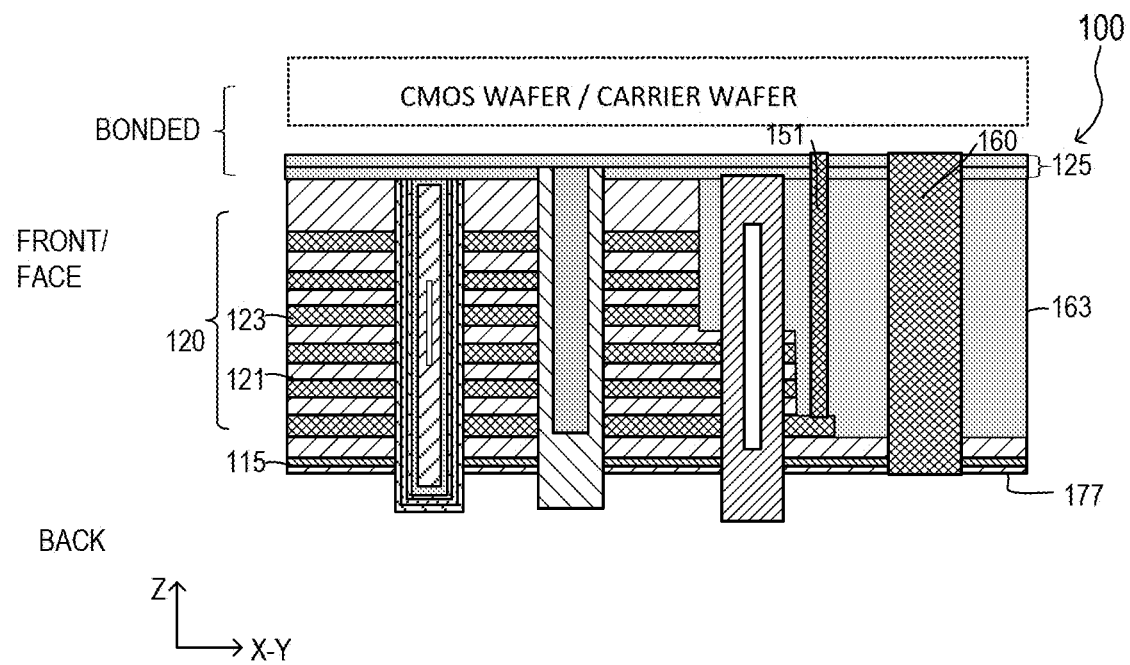
Figure 4K:
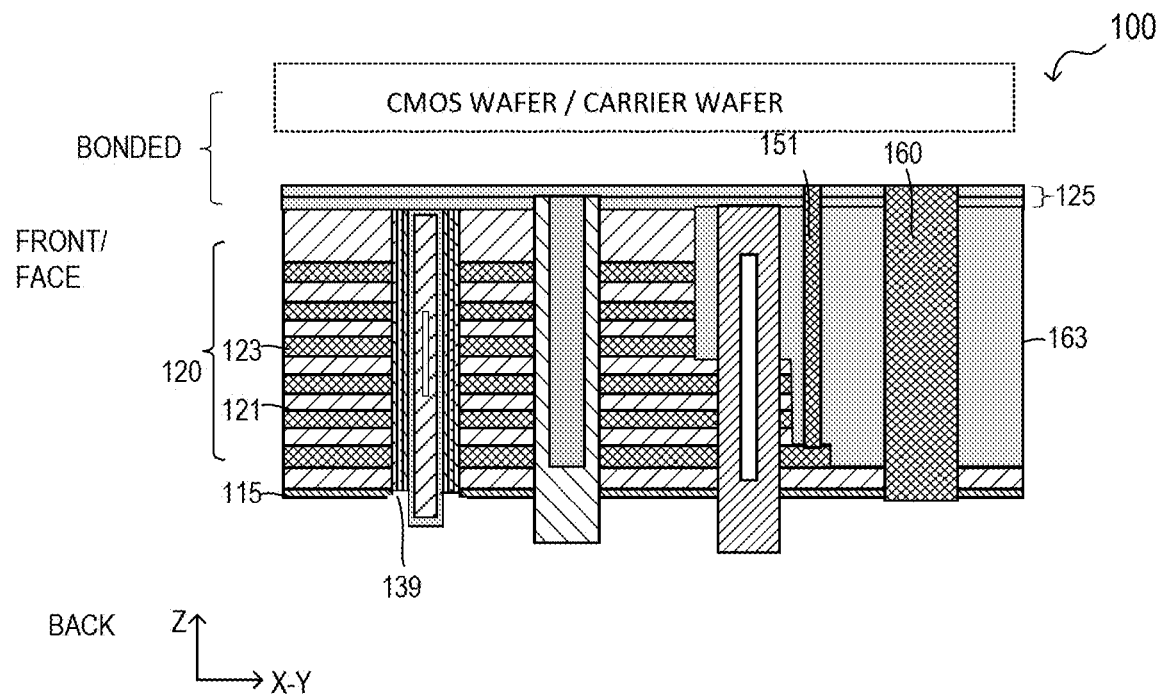
Figure 4L:
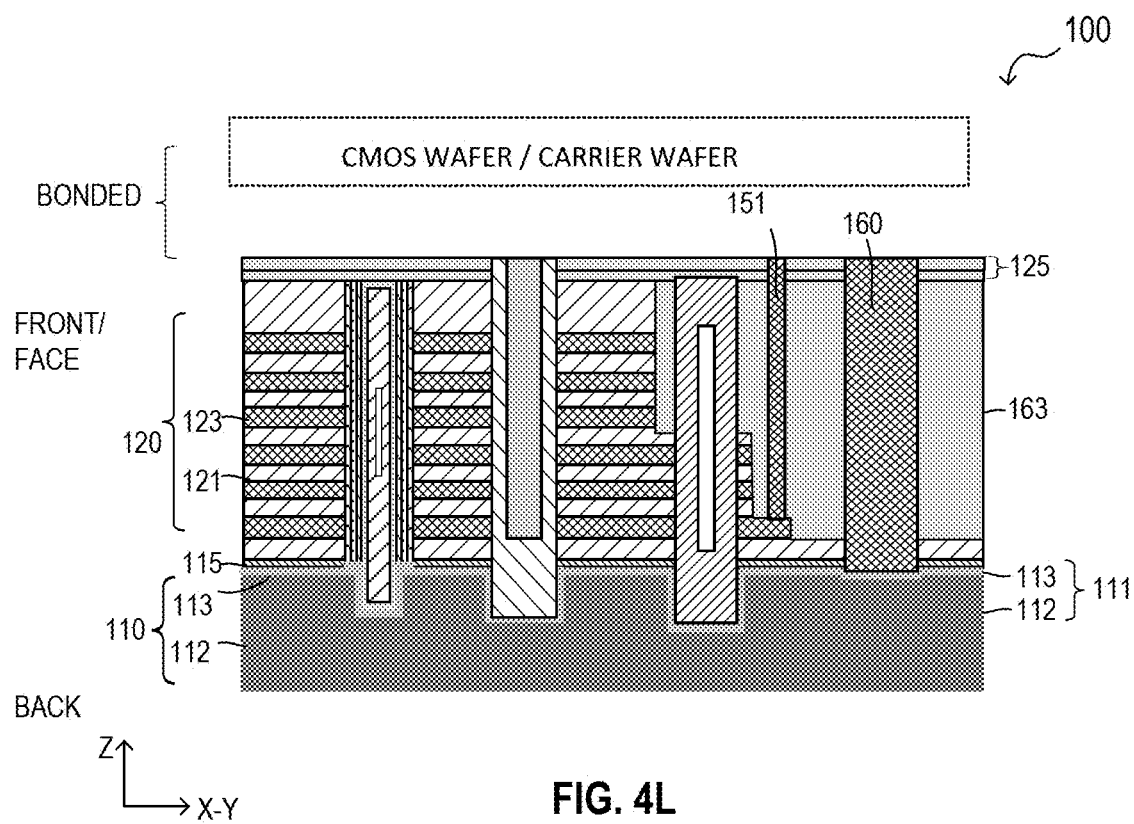
Figure 4M:
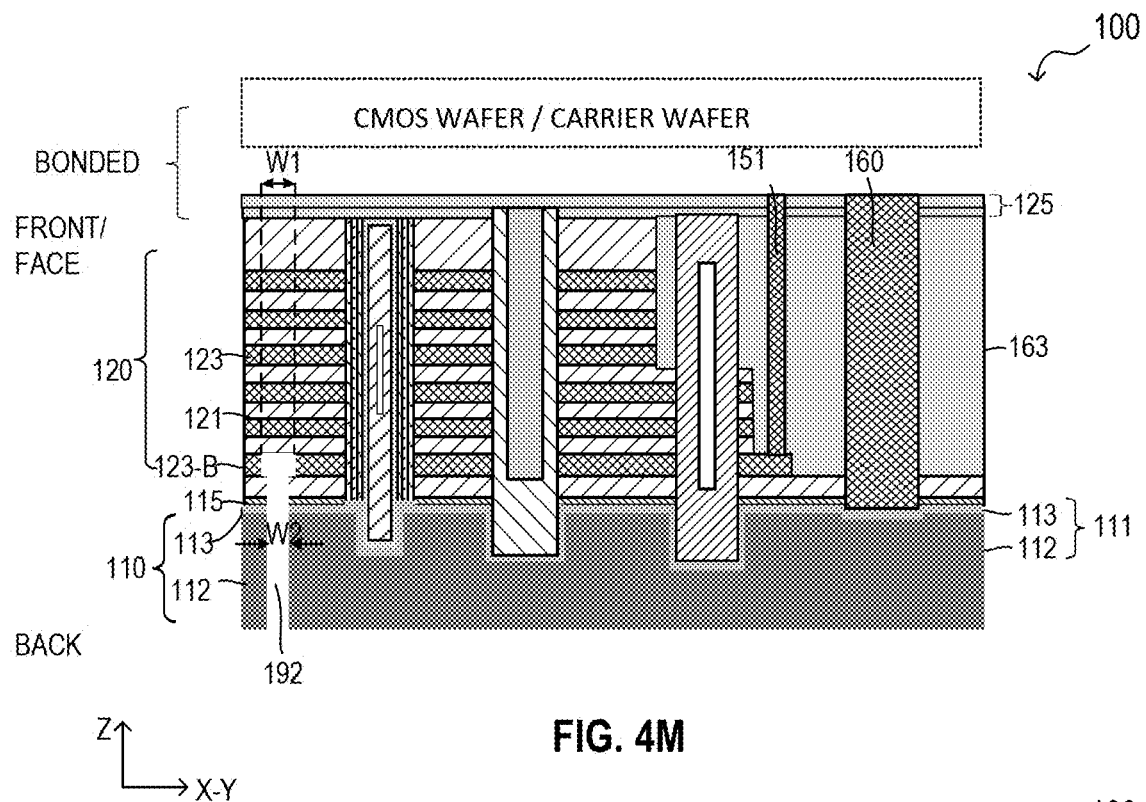
Figure 4N:
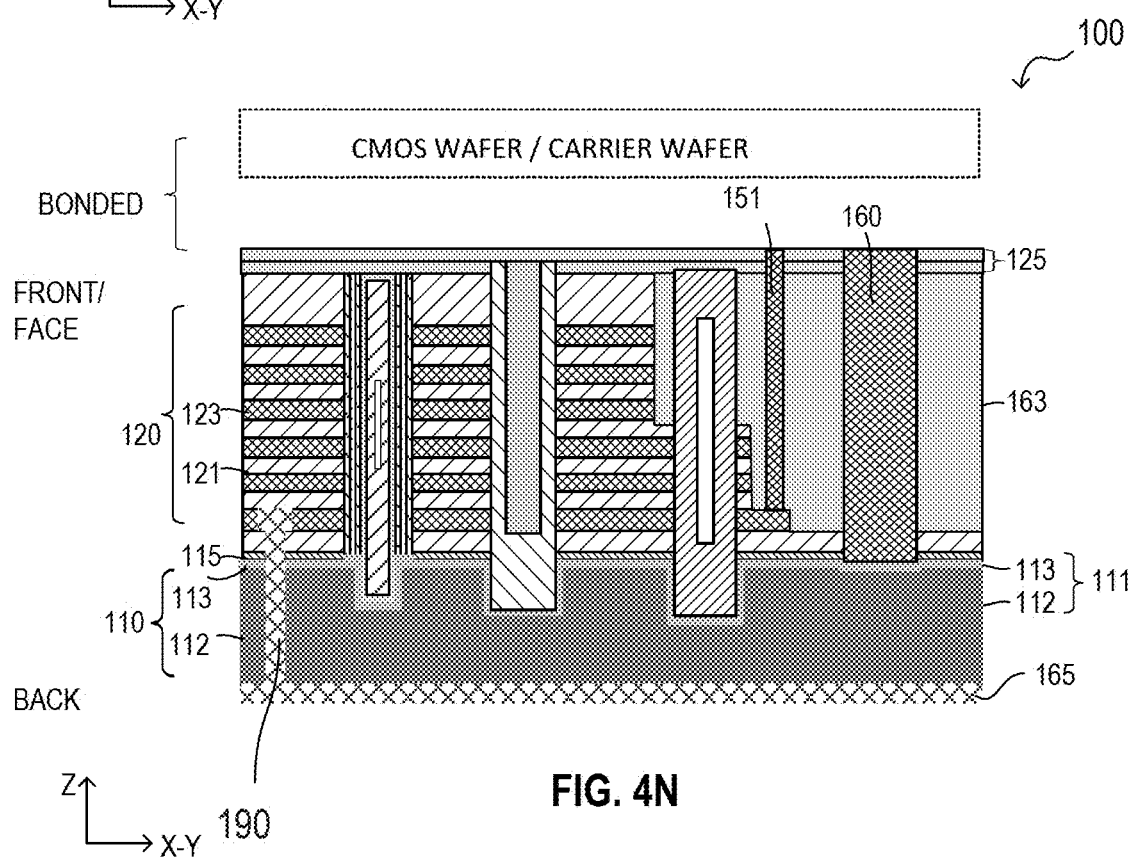
Figure 4O:
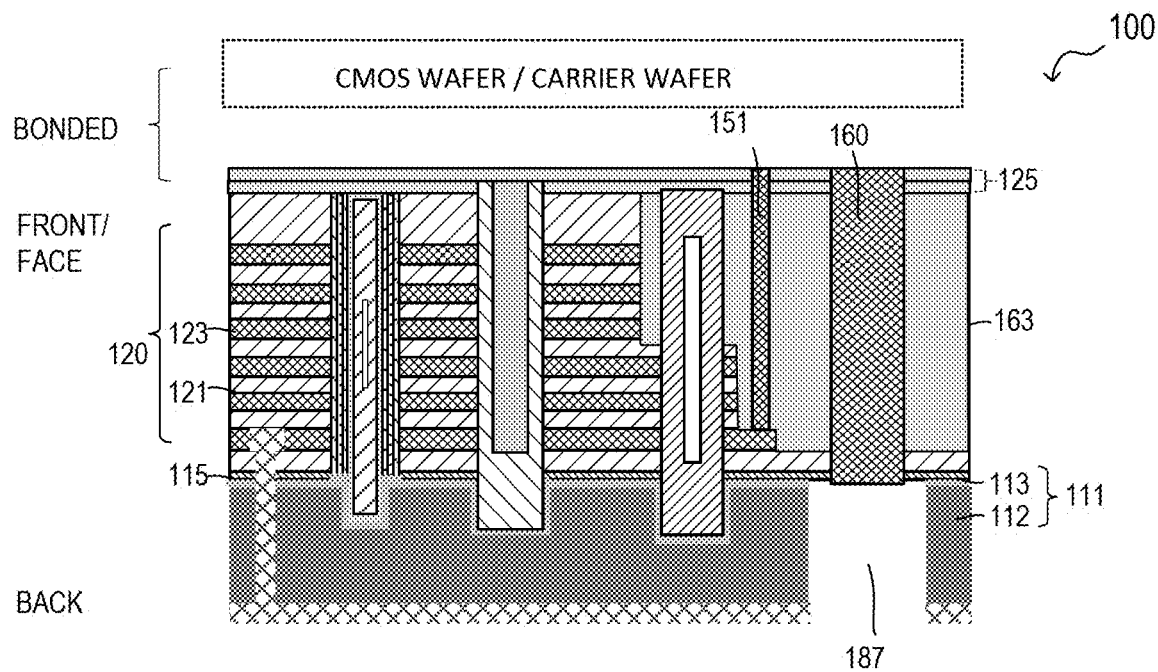
Figure 4P:
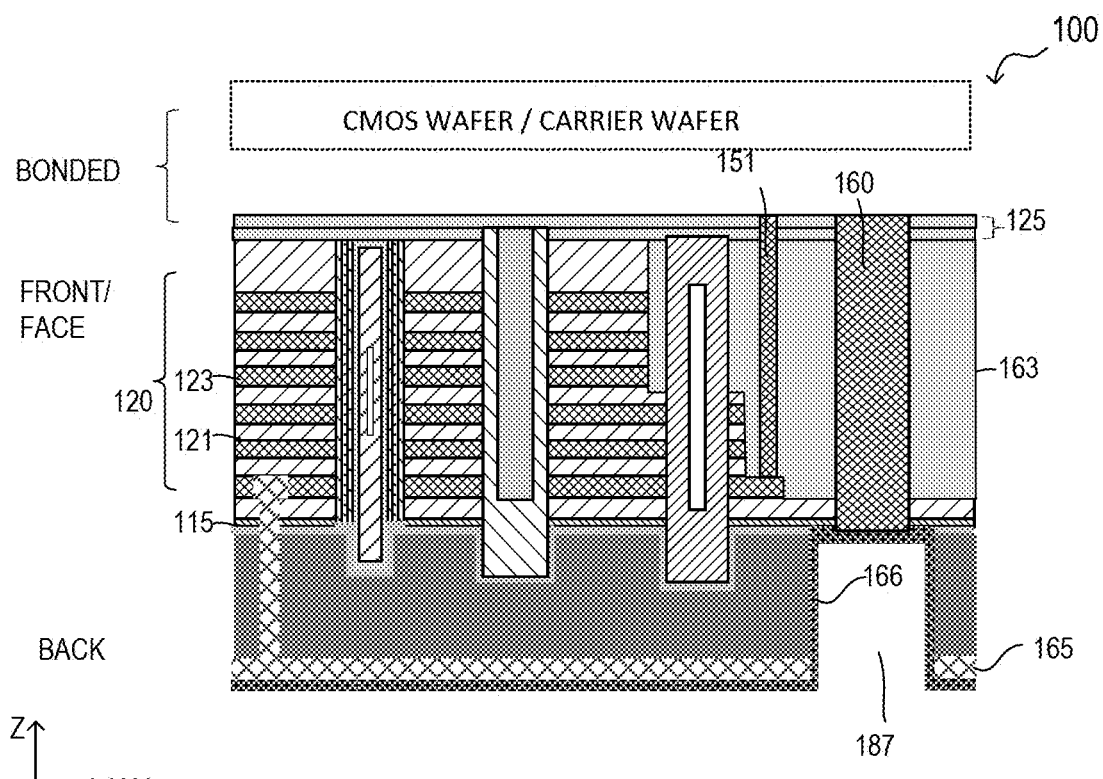
Figure 4Q:
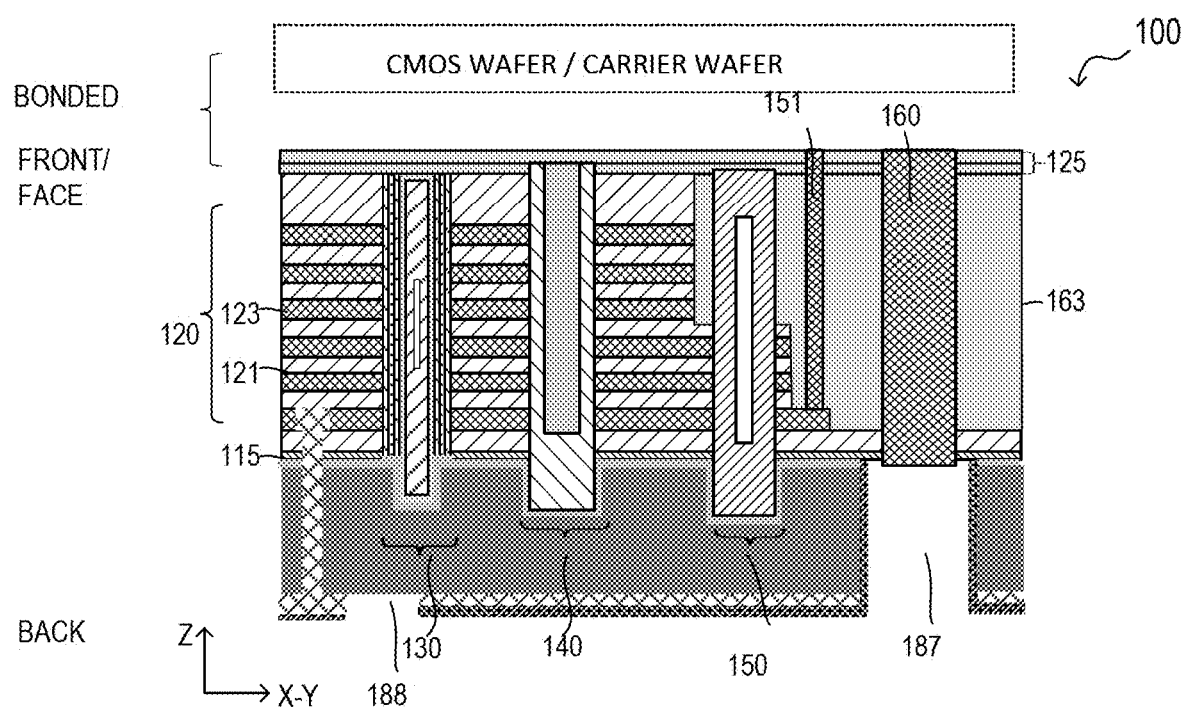
Figure 4R:
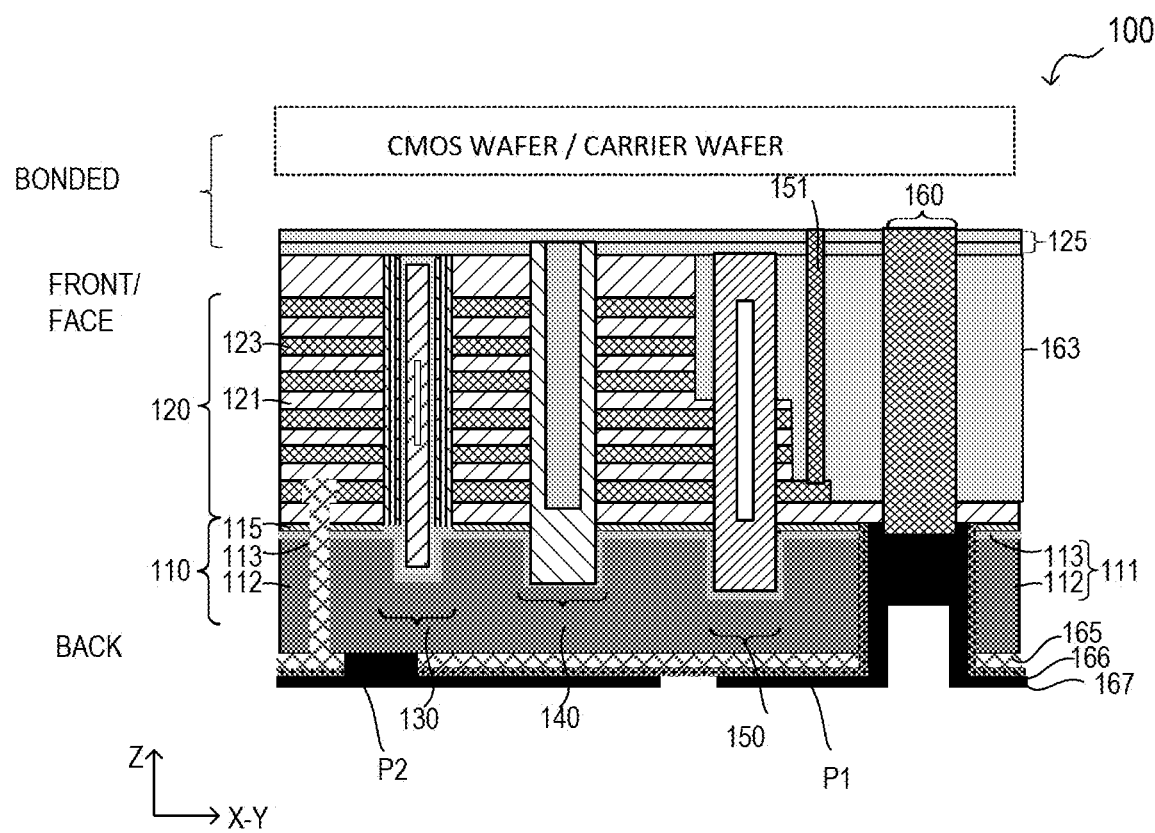

FIGS. 4A-4R are cross-sectional views of a semiconductor device, such as the semiconductor device 100, at various intermediate steps of wafer level manufacturing, in accordance with some embodiments of the present disclosure. It is noted that while a gate-last process is used to illustrate the manufacturing steps for the semiconductor device 100, the semiconductor device 100 may be formed by a gate-first process.

For ease of illustration, one channel structure 130, one gate line slit structure 140, one dummy channel structure 150, one peripheral contact structure 160, one gate contact structure 171, and one BSG cot structure 190 are shown in FIGS. 4A-4R. It is noted that the same processing steps can be performed to form a plurality of channel structures 130, a plurality of gate line slit structures 140, a plurality of dummy channel structures 150, a plurality of peripheral contact structures 160, a plurality of gate contact structures and a plurality of BSG cut structures 190.

FIG. 4A shows a cross-sectional view of the semiconductor device 100 after a deposition of an initial first stack 110' of layers on a substrate 171. The substrate 171 is also referred to as a first wafer, or an array wafer. In the FIG. 4A example, the initial first stack 110' includes a first oxide layer 173, a stop layer 175, a second oxide layer 177, a top etch stop layer 115, and a third oxide layer 179 that are sequentially deposited on the substrate 171. The top etch stop layer 115 and the stop layer 175 are used for etch stopping of different etch processes, and will be described in detail in the following description. In an example, the stop layer 175 includes tungsten, and has a thickness to ensure the etching of channel holes for forming channel structures, the etching of dummy channel holes for forming the dummy channel structure, and the etching of trenches for forming gate line slit structures, can stop in the stop layer 175. In some examples, the tungsten is removed in a later process using back side processing, and then the semiconductor layer 111 can be formed. It is noted that the present disclosure does not limit the stop layer 175 to be tungsten, and the stop layer 175 can be other suitable material. In an example, the stop layer 175 is polysilicon, the stop layer 175 can be removed and then the semiconductor layer 111 can be formed. In another example, the stop layer 175 is polysilicon, the stop layer 175 does not need to be removed, and can be the semiconductor layer 111. It is also noted that the first oxide layer 173 and the second oxide layer 177 can be substituted with other suitable material, such as silicon nitride, and the like. In some examples, the top etch stop layer 115 is a polysilicon layer.

FIG. 4B shows a cross-sectional view of the semiconductor device 100 after channel holes 183 for forming channel structures are etched through an initial second stack. 120' of layers. The etching of the channel boles 183 stops in the stop layer 175. For example, the initial second stack 120' of layers is formed over the initial first stack 110' of layers. The initial second stack 120' of layers can include insulating layers 121 (e.g., silicon oxide) and sacrificial gate layers 122 (e.g., silicon nitride) which are stacked alternatingly in the Z direction. Then, photo lithography technology is used to define patterns of channel holes in photoresist and/or hard mask layers, and etch technology is used to transfer the patterns into the initial second stack 120' of layers and the initial first stack 110' of layers, and the etch stops in the stop layer 175.

FIG. 4C shows a cross-sectional view of the semiconductor device 100 after channel structures 130 are formed. In an example, the blocking insulating layer 133 (e.g., silicon dioxide) is formed on the sidewall of channel holes, and then the charge storage layer 134 (e.g., silicon nitride), the tunneling insulating layer 135, the semiconductor layer 136, and the insulating layer 137 are sequentially stacked from the sidewall.

It is noted that the channel structures 130 is not limited to a single deck form as shown in FIG. 4C. In some examples (not shown), the channel structures 130 are formed using multi-deck technology. For example, a channel structure 130 includes a lower channel structure in a lower deck and an upper channel structure in an upper deck. The lower channel structure and the upper channel structurer are suitably joined to form the channel structure 130.

FIG. 4D shows a cross-sectional view of the semiconductor device 100 after dummy channel holes 185 for forming dummy channel structures are etched through layers in the staircase region. In some examples, stair steps are suitable formed in the staircase region, and the insulating material 163 (e.g., silicon oxide) is filled and suitably planarized (e.g., using CMP). Then, photo lithography technology is used to define patterns of dummy channel holes in photoresist and/or hard mask layers, and etch technology is used to transfer the patterns into layers in the staircase region, and the etch stops in the stop layer 175.

FIG. 4E shows a cross-sectional view of the semiconductor device 100 after dummy channel structures 150 are formed. In some examples, one or more insulating layers are formed in the dummy channel holes. In an example, one or more insulating layers are deposited and excess insulating materials at areas out of the dummy channel holes can be removed for example by chemical mechanical polishing (CMP) and or etch process.

FIG. 4F shows a cross-sectional view of the semiconductor device 100 after trenches 184 for forming the gate line slit structures are etched through layers in the gate line slit region. The trenches 184 are also referred to as gate line slits or gate line cuts. In some examples, photo lithography technology is used to define patterns of the trenches in photoresist and/or hard mask layers, and etch technology is used to transfer the patterns into the initial second stack 120' of layers and the initial first stack 110' of layers, and the etch stops in the stop layer 175.

It is noted that, in some examples, an initial capping layer, such as shown by 125' is deposited on the front side before the forming the gate line slit structures. In an example, the initial capping layer 125' can be silicon dioxide.

FIG. 4G shows a cross-sectional view of the semiconductor device 100 after the gate line slit structures 140 are formed in the gate line slit region 103.

In some examples, using the trenches, the sacrificial gate layers 122 can be replaced by the gate layers 123 to form the second stack 120 of layers. In an example, etchants to the sacrificial gate layers 122 are applied via the trench to remove the sacrificially gate layers. In an example, the sacrificial gate layers are made of silicon nitride, and the hot sulfuric acid ($H_2SO_4$) is applied via the trenches to remove the sacrificial gate layers. Further, via the trenches, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon dioxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon dioxide ($ZrSiO_4$), hafnium zirconium oxide ($HfZrO_4$), and the like. The glue layer can include refractory metals, such as titanium (Ti), tantalum (Ta) and their nitrides, such as TIN, TaN, $W_2N$, TiSiN, TaSiN, and the like. The metal layer includes a metal having high conductivity, such as tungsten (W), copper (Cu) and the like.

Further, the trenches can be filled to form the gate line slit structures 140. In some examples, one or more insulating layers are formed in the trenches. In an example, one or more insulating layers are deposited and excess insulating material at areas out of the trenches can be removed for example by CMP and/or etch process. In some examples, conductive material, such as tungsten, can be used to form array common source terminal in the gate line slit structures 140.

In some examples, additional capping layer, such as silicon oxide can be deposited, and planarized. In FIG. 4G, a combination of the capping layers is shown as a capping layer 125.

FIG. 4H shows a cross-sectional view of the semiconductor device 100 after contact holes are generated. For example, a contact hole 186 for forming a peripheral contact structure is etched through layers in the peripheral contact region 104. In some examples, the peripheral contact structures can be formed with the gate contact structures at the same time. In the FIG. 4H example, a contact hole 156 for forming a gate contact structure is formed in the staircase region 102. In an example, the contact hole 186 and the contact hole 156 are formed by same processes. For example, photo lithography technology is used to define patterns of the contact hole 186 and the contact hole 156 in photoresist and/or hard mask layers, and a contact etch process is performed to transfer the patterns into the capping layer 125 and the insulating material 163, and the contact etch process can stop based on etch stop material for the contact etch process. In an example, the contact etch process can be configured to stop etching based on tungsten. For example, the gate layers 123 and the stop layer 175 are made of tungsten, thus the etching of the hole 176 can stop based on the gate layer 123-B, and the etching of the hole 186 can stop based on the stop layer 175.

According to some aspects of the disclosure, separate contact holes for connecting the BSG portions, such as 191-1, 191-2, 191-3 and 191-4, and the like are formed.

It is noted that, in some examples, the peripheral contact structures and the gate contact structures (also referred to as word line contact structures) can be formed separately. The contact holes for the peripheral contact structures and the contact holes for the gate contact structures can be formed by different contact etch processes that can be configured to stop etching based on different materials. In an example, the contact etch process that generates the contact holes (e.g., the contact hole 186) for the peripheral contact structures can be configured to stop etching based on the top etch stop layer 115.

FIG. 4I shows a cross-sectional view of the semiconductor device 100 after contact structures, such as the peripheral contact structure 160 and the gate contact structure 151, are formed in the contact holes. For example, suitable liner layer (e.g., titanium/titanium nitride) and a metal layer (e.g., tungsten) can be filled into the contact holes 186 and 156 to form the peripheral contact structure 160 and the gate contact structure 151. It is noted that gate contact structures that respectively connect to the sub portions 191-1, 191-2, 191-3 and 191-4 can be formed.

According to an aspect of the disclosure, additional processes can be further performed on the front side of the array wafer to form additional structures (not shown) on the front side of the array wafer, such as one or more layers of metal wires, and the like.

In some embodiments, bonding structures (not shown) are then formed on the front side of the array wafer. Further, in an embodiment, the array wafer is bonded with a CMOS wafer face to face. In another example, the array wafer is bonded with a carrier wafer. Then, backside processing can be performed on the array wafer.

FIG. 4J shows a cross-sectional view of the semiconductor device 100 after the stop layer 175 is removed by the backside processing. In some examples, the substrate 171 is removed by the backside processing, such as applying CMP process, and/or etch process on the backside of the array wafer. Then, the oxide layer 173 is removed by backside processing, such as applying CMP process, and/or etch process on the backside of the array wafer. Then, the stop layer 175 is removed by the backside processing, such as applying CMP process, and/or etch process on the backside of the array wafer.

As a result, the ends of the channel structures 130, the ends of the gate line slit structures 140, the ends of the dummy channel structures 150 and the ends of the peripheral contact structures 160 can be exposed from the backside of the array wafer.

FIG. 4K shows a cross-sectional view of the semiconductor device 100 after the blocking insulating layer, the charge storage layer, and the tunneling insulating layer, are removed from the ends of the channel structures 130 by the backside processing. In some examples, the blocking insulating layer is made of silicon oxide, the charge storage layer is made of silicon nitride and the tunnel insulating layer is made of silicon oxide, and etch processes that remove silicon oxide, silicon nitride and silicon oxide can be suitably configured to remove the blocking insulating layer, the charge storage layer, and the tunneling insulating layer, are removed from the ends of the channel structures 130. It is noted that the second oxide layer 177 is also removed by the backside processing. In some examples, areas covered by the top etch stop layer 115 are protected from the etch processes that remove the blocking insulating layer, the charge storage layer, and the tunneling insulating layer. It is also noted that the profile of the blocking insulating layer, the charge storage layer, and the tunneling insulating after the etching processes may depend on the configurations of the etch processes, and is not limited to the profile 139 in FIG. 4K.

FIG. 4L shows a cross-sectional view of the semiconductor device 100 after the semiconductor layer 111 is formed by the backside processing. In some examples, the semiconductor layer 111 includes a bulk portion 112 and a liner portion 113 (e.g. a conformal portion). The liner portion 113 can be formed by, for example, atomic layer deposition and doped by ion implantation. Then, the bulk portion 112 can be formed, for example by chemical vapor deposition (CVD), and planarized by CMP. The bulk portion 112 can be doped in situ during CVD or doped by ion implantation after CVD. A post-annealing step, such as laser annealing, may be executed to activate dopants and/or repair crystal damages. In some examples, the semiconductor layer 111 only includes the bulk portion 112.

FIG. 4M shows a cross-sectional view of the semiconductor device 100 after trenches 192 for forming the BSG cut structures are formed. For example, photo lithography technology is used to define patterns of the BSG cut structures in photoresist and/or hard mask layers, and etch technology is used to transfer the patterns into the semiconductor layer 111, the top etch stop layer 115, and into the second stack 120 of layers. In an example (shown in FIG. 4M), the etch process can form trenches that cut a bottom gate layer (shown by 123-B) in the second stack 120 of layers. Thus, the bottom gate layer 123-B can be cut into sub portions, such as the sub portions 191-1 to 191-4 in FIG. 1A. In another example (not shown), the etch process can form trenches that cut a plurality of bottom gate layers 123 in the second stack 120 of layers.

In some examples, a dry etch process is used to etch the trenches 192 for forming the BSG cut structures. Because the gate layers 123 include tungsten, the dry etch may leave tungsten residues on the sidewall of the trenches 192. The tungsten residues can cause shorts between sub portions. In some examples, a wet etch process can be used to remove tungsten residues. The wet etch process can recess, for example, the gate layer 123-B. and create a wider opening in the gate layer 123-B as compared to the opening in the semiconductor layer 111. For example, the opening width in the gate layer 123-B is W1, and the opening width in the semiconductor layer 111 is W2, and W1 is larger than W2.

FIG. 4N shows a cross-sectional view of the semiconductor device 100 after the BSG cut structures 190 are formed. In some examples, atomic layer deposition (ALD) is used to deposit insulating material, such as silicon oxide and the like. The ALD can deposit thin and conformal film and the deposited insulating material can fill the trenches 192 and form the BSG cut structures 190. It is noted that the insulating layer 165 is formed over the semiconductor layer 111 by the ALD at the same time as the BSG cut structures 190.

FIG. 4O shows a cross-sectional view of the semiconductor device 100 after a through silicon hole 187 is formed in the semiconductor layer 111 to expose the end of the peripheral contact structure 160 from the backside of the array wafer.

FIG. 4P shows a cross-sectional view of the semiconductor device 100 after a spacer layer 166 is formed from the backside of the array wafer.

FIG. 4Q shows a cross-sectional view of the semiconductor device 100 after some portions of the spacer layer 166 are removed. For example, the spacer layer 166 is removed from a bottom of the through silicon hole 187 so that the peripheral contact structure 160 is exposed. It is noted that a portion of the insulating layer 165 and the spacer layer 166 on the semiconductor layer 111 is removed to generate an opening 188.

FIG. 4R shows a cross-sectional view of the semiconductor device 100 after pad structures are formed on the back side of the array die. For example, the conductive layer 167 is deposited on the backside of the array wafer, and the conductive layer 167 can be patterned (e.g., using lithography process and etch process), for example into pad structures, such as shown by P1 and P2. In some examples, the conductive layer 167 includes aluminum.

It is noted that the semiconductor device 100 can be suitably used in a memory system.

Figure 5:
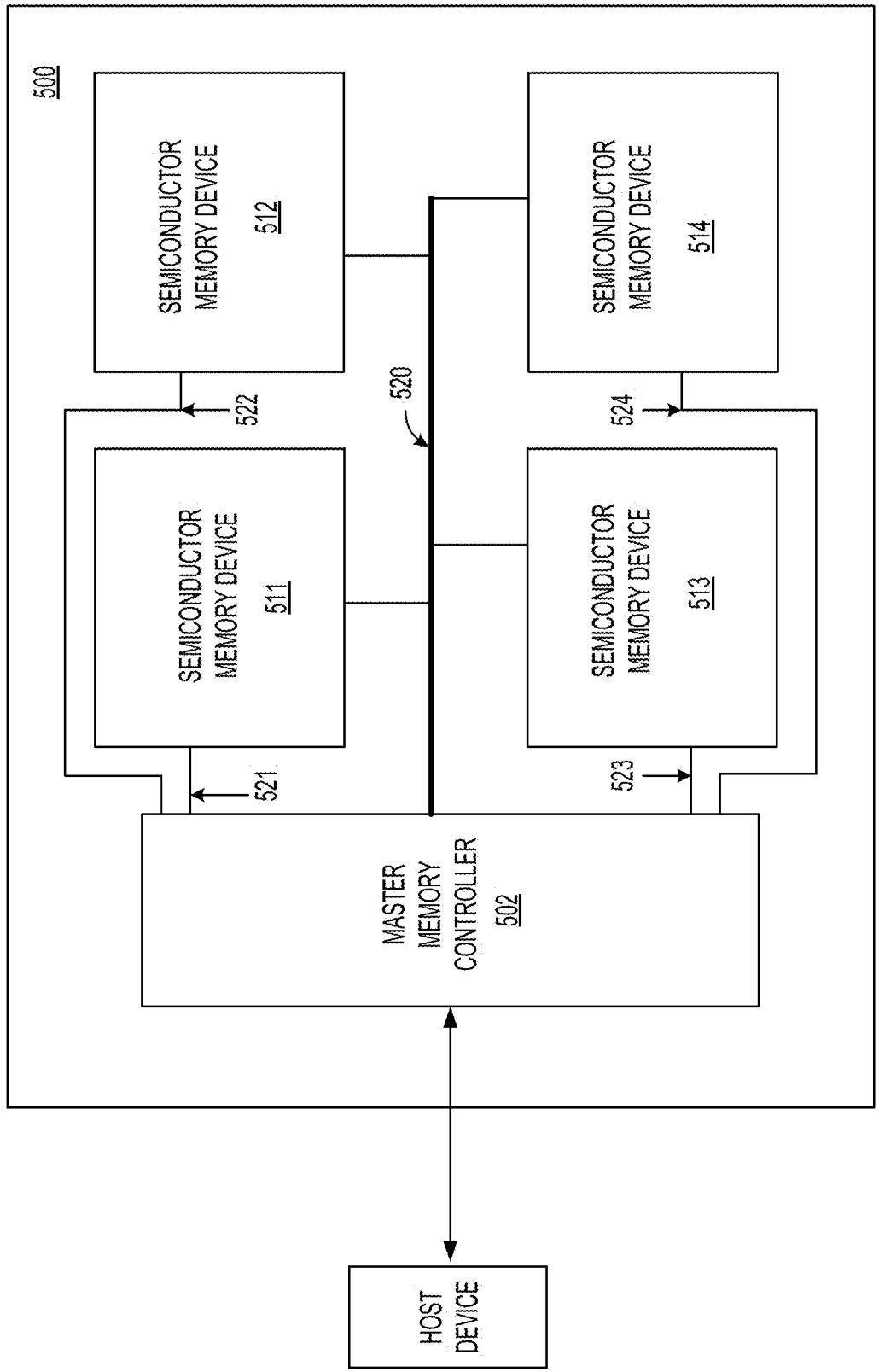
FIG. 5 shows a block diagram of a memory system device according to some examples of the disclosure.

FIG. 5 shows a block diagram of a memory system 500 according to some examples of the disclosure. The memory system 500 includes one or more semiconductor memory devices, such as shown by semiconductor memory devices 511-514, that are respectively configured similarly as the semiconductor device 100. In some examples, the memory system 500 is a solid state drive (SSD).

The memory system 500 includes other suitable components. For example, the memory system 500 includes a master memory controller 502. The master memory controller 502 is coupled with the semiconductor memory devices 511-514 for example by a bus 520. In addition, the master memory controller 502 is connected with the semiconductor memory devices 511-514 respectively, such as shown by respective control lines 521-524.

The master memory controller 502 is configured to connect the respective semiconductor memory devices 511-514 to the host device for data transfer. For example, the master memory controller 502 is configured to provide enable/disable signals respectively to the semiconductor memory devices 511-514 to active one or more semiconductor memory devices 511-514 for data transfer.

The master memory controller 502 is responsible for the completion of various instructions within the memory system 500. For example, the master memory controller 502 can perform bad block management, error checking and correction, garbage collection, and the like.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack of conductive layers and insulating layers being stacked alternatingly in a first direction, the stack of conductive layers and insulating layers having a first side and a second side in the first direction;
   a semiconductor layer at the first side of the stack of conductive layers and insulating layers; and
   a first isolation structure extending through, in the first direction, the semiconductor layer and a subset of the stack of conductive layers and insulating layers, the subset of the stack of conductive layers and insulating layers comprising a first conductive layer, the first isolation structure separating a first portion of the first conductive layer from a second portion of the first conductive layer.

2. The semiconductor device of claim 1, further comprising:
   a first gate line slit (GLS) structure and a second GLS structure extending through the stack of conductive layers and insulating layers in the first direction, the first GLS structure and the second GLS structure being parallel in a second direction that is perpendicular to the first direction, wherein the first isolation structure is between the first GLS structure and the second GLS structure and is parallel to the first GLS structure and the second GLS structure.

3. The semiconductor device of claim 2, further comprising:
   a second isolation structure that extends through, in the first direction, the semiconductor layer and the subset of the stack of conductive layers and insulating layers, wherein the second isolation structure and the first isolation structure are between the first GLS structure and the second GLS structure and are parallel to the first GLS structure and the second GLS structure.

4. The semiconductor device of claim 1, wherein the subset of the stack of conductive layers and insulating layers comprises the first conductive layer and at least a second conductive layer.

5. The semiconductor device of claim 1, wherein a first width of the first isolation structure between the first portion of the first conductive layer and the second portion of the first conductive layer is wider than a second width of the first isolation structure between a first portion of the semiconductor layer and a second portion of the semiconductor layer.

6. The semiconductor device of claim 1, further comprising:
   a first contact structure connected to the first portion of the first conductive layer; and
   a second contact structure connected to the second portion of the first conductive layer.

7. The semiconductor device of claim 1, wherein the semiconductor layer comprises polysilicon.

8. A method for fabricating a semiconductor device, comprising:
   forming a stack of conductive layers and insulating layers that are stacked alternatingly in a first direction, the stack of conductive layers and insulating layers having a first side and a second side in the first direction;
   forming a semiconductor layer at the first side of the stack of conductive layers and insulating layers; and
   forming a first isolation structure that extends through, in the first direction, the semiconductor layer and a subset of the stack of conductive layers and insulating layers, the subset of the stack of conductive layers and insulating layers comprising a first conductive layer, the first isolation structure separating a first portion of the first conductive layer from a second portion of the first conductive layer.

9. The method of claim 8, further comprising:
   forming a first gate line slit (GLS) structure and a second GLS structure that extend through the stack of conductive layers and insulating layers in the first direction, the first GLS structure and the second GLS structure being parallel in a second direction that is perpendicular to the first direction, wherein the first isolation structure is between the first GLS structure and the second GLS structure and is parallel to the first GLS structure and the second GLS structure.

10. The method of claim 9, further comprising:
    forming a second isolation structure that extends through, in the first direction, the semiconductor layer and the subset of the stack of conductive layers and insulating layers between the first GLS structure and the second GLS structure, wherein the second isolation structure and the first isolation structure are between the first GLS structure and the second GLS structure and are parallel to the first GLS structure and the second GLS structure.

11. The method of claim 8, wherein the forming the first isolation structure comprises:
    forming a trench in the semiconductor layer and the subset of the stack of conductive layers and insulating layers; and
    filling the trench with insulating material.

12. The method of claim 11, wherein the forming the trench comprises:
    performing a first etching process that creates an opening in the semiconductor layer and the subset of the stack of conductive layers and insulating layers in the first direction; and
    performing a second etching process that recesses the first conductive layer based on the opening.

13. The method of claim 11, wherein filling the trench with the insulating material comprises:
    depositing the insulating material using atomic layer deposition (ALD).

14. The method of claim 8, wherein forming the semiconductor layer comprises:

removing an initial stack of layers from the first side of the stack of conductive layers and insulating layers; and depositing the semiconductor layer at the first side of the stack of conductive layers and insulating layers.

15. A semiconductor memory device, comprising:
a first die comprising:
a stack of conductive layers and insulating layers being stacked alternatingly in a first direction, the stack of conductive layers and insulating layers having a first side and a second side in the first direction;
a semiconductor layer at the first side of the stack of conductive layers and insulating layers; and
a first isolation structure extending through, in the first direction, the semiconductor layer and a subset of the stack of conductive layers and insulating layers, the subset of the stack of conductive layers and insulating layers comprising a first conductive layer, the first isolation structure separating a first portion of the first conductive layer from a second portion of the first conductive layer; and
a second die that is bonded with the first die and is closer to the second side than to the first side of the stack of conductive layers and insulating layers.

16. The semiconductor memory device of claim 15, further comprising:
a first gate line slit (GLS) structure and a second GLS structure extending through the stack of conductive layers and insulating layers in the first direction, the first GLS structure and the second GLS structure being parallel in a second direction that is perpendicular to the first direction; and
an array of channel structures between the first GLS structure and the second GLS structure, a channel structure of the array of channel structures extending the stack of conductive layers and insulating layers, wherein the first isolation structure is between the first GLS structure and the second GLS structure and separating the array of channel structures into a first sub array and a second sub array.

17. The semiconductor memory device of claim 16, further comprising:

a second isolation structure that extends through, in the first direction, the semiconductor layer and the subset of the stack of conductive layers and insulating layers, wherein the second isolation structure and the first isolation structure are between the first GLS structure and the second GLS structure and are parallel to the first GLS structure and the second GLS structure.

18. The semiconductor memory device of claim 15, wherein the second die comprises:
a first circuit that is conductively coupled to the first portion of the first conductive layer; and
a second circuit that is conductively coupled to the second portion of the first conductive layer.

19. The semiconductor memory device of claim 15, wherein a first width of the first isolation structure between the first portion of the first conductive layer and the second portion of the first conductive layer is wider than a second width of the first isolation structure between a first portion of the semiconductor layer and a second portion of the semiconductor layer.

20. A memory system, comprising:
a memory controller configured to control data storage operations of a semiconductor memory device; and
the semiconductor memory device comprising:
a stack of conductive layers and insulating layers being stacked alternatingly in a first direction, the stack of conductive layers and insulating layers having a first side and a second side in the first direction;
a semiconductor layer at the first side of the stack of conductive layers and insulating layers; and
a first isolation structure extending through, in the first direction, the semiconductor layer and a subset of the stack of conductive layers and insulating layers, the subset of the stack of conductive layers and insulating layers comprising a first conductive layer, the first isolation structure separating a first portion of the first conductive layer from a second portion of the first conductive layer.

\* \* \* \* \*